(12) United States Patent
Kraemer et al.

(10) Patent No.: US 10,912,198 B2
(45) Date of Patent: Feb. 2, 2021

(54) FLEXIBLE CAPACITORS AND METHODS FOR MANUFACTURING FLEXIBLE CAPACITORS

(71) Applicant: Sateco AG, Nänikon (CH)

(72) Inventors: Ronny Kraemer, Dällikon (CH); Daniel Haefliger, Au ZH (CH)

(73) Assignee: Safeco AG, Nänikon (CH)

( * ) Notice: Subject to any disclaimer, the term of this patent is extended or adjusted under 35 U.S.C. 154(b) by 207 days.

(21) Appl. No.: 16/310,996

(22) PCT Filed: May 22, 2017

(86) PCT No.: PCT/IB2017/052999
§ 371 (c)(1),
(2) Date: Dec. 18, 2018

(87) PCT Pub. No.: WO2018/037291
PCT Pub. Date: Mar. 1, 2018

(65) Prior Publication Data
US 2020/0187355 A1    Jun. 11, 2020

(30) Foreign Application Priority Data
Aug. 25, 2016 (CH) .................................. 01089/16

(51) Int. Cl.
*H05K 1/16* (2006.01)
(52) U.S. Cl.
CPC ..... *H05K 1/162* (2013.01); *H05K 2201/0355* (2013.01)
(58) Field of Classification Search
CPC ........................ H05K 1/162; H05K 2201/0355
(Continued)

(56) References Cited

U.S. PATENT DOCUMENTS

| 9,418,791 B1* | 8/2016 | Johnson ................ H01G 4/30 |
| 2011/0080690 A1* | 4/2011 | Ning ...................... H01G 11/48 |
| | | 361/525 |

(Continued)

FOREIGN PATENT DOCUMENTS

EP    1769975 A1    4/2007

OTHER PUBLICATIONS

International Search Report and Written Opinion for PCT/IB2017/052999 dated Jul. 25, 2017, 13 pages.
(Continued)

*Primary Examiner* — Sherman Ng
(74) *Attorney, Agent, or Firm* — Blank Rome LLP

(57) ABSTRACT

According to the present invention there is provided a capacitor (100, 200,900,120,150,300) comprising, a flexible strip (1,50,60,110,130,260) comprising a first region (2a) having a plurality of nodules (5,61,261,262) and a second region (2b) having a plurality of nodules (5,61,261,262), and wherein the strip further comprises a first flexible portion (3a) which is interposed between the first and second regions (2a,b), and wherein the flexible strip (1,50,60,110, 130,260) is folded at the first flexible portion (3a) so that, the first and second regions (2a,b) overlay one another and the nodules (5,61,261,262) of the first region (2a) extend in a direction towards the second region (2b), and the nodules (5,61,261,262) of the second region (2b) extend in a direction towards the first region (2a), and wherein the flexible strip (1,50,60,110,130,260) comprises electrically conductive material; and a flexible foil (20, 80,140) which is arranged to be interposed between the first and second regions (2a,b), and wherein the foil (20, 80,140) comprises electrically conductive material. There is further provided a corresponding method of manufacturing said capacitor.

15 Claims, 26 Drawing Sheets

(58) Field of Classification Search
USPC .......................................................... 361/307
See application file for complete search history.

(56) References Cited

U.S. PATENT DOCUMENTS

| | | | | |
|---|---|---|---|---|
| 2014/0326079 | A1* | 11/2014 | Maeda | G01L 1/142 |
| | | | | 73/862.626 |
| 2016/0268921 | A1* | 9/2016 | Feuerstack | H05K 7/209 |
| 2017/0238991 | A1* | 8/2017 | Worrell | H05K 3/061 |
| 2019/0131969 | A1* | 5/2019 | Boese | G01L 1/142 |

OTHER PUBLICATIONS

H. Brise, et al., "Capacitive Sensor Mats for Pressure Detection with High Sensitivity", AMA Conferences 2015, www.ama-science.org/proceedings/getFile/ZGxiZD; May 21, 2015, pp. 55-60.

* cited by examiner

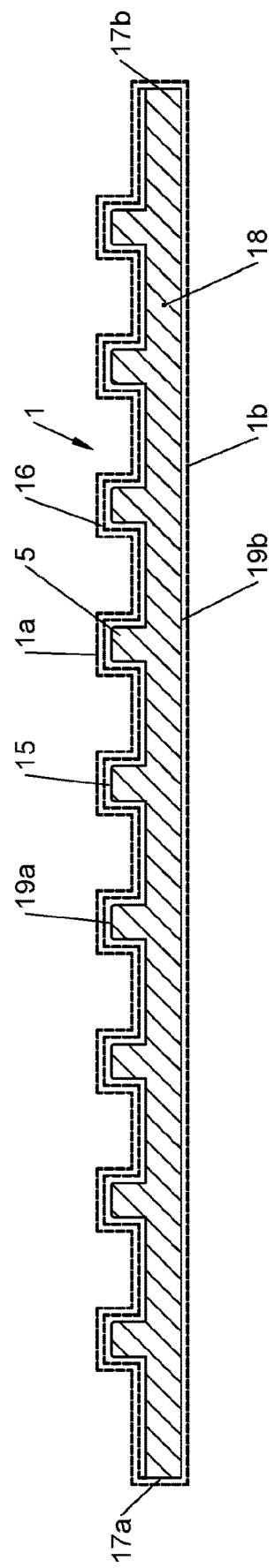

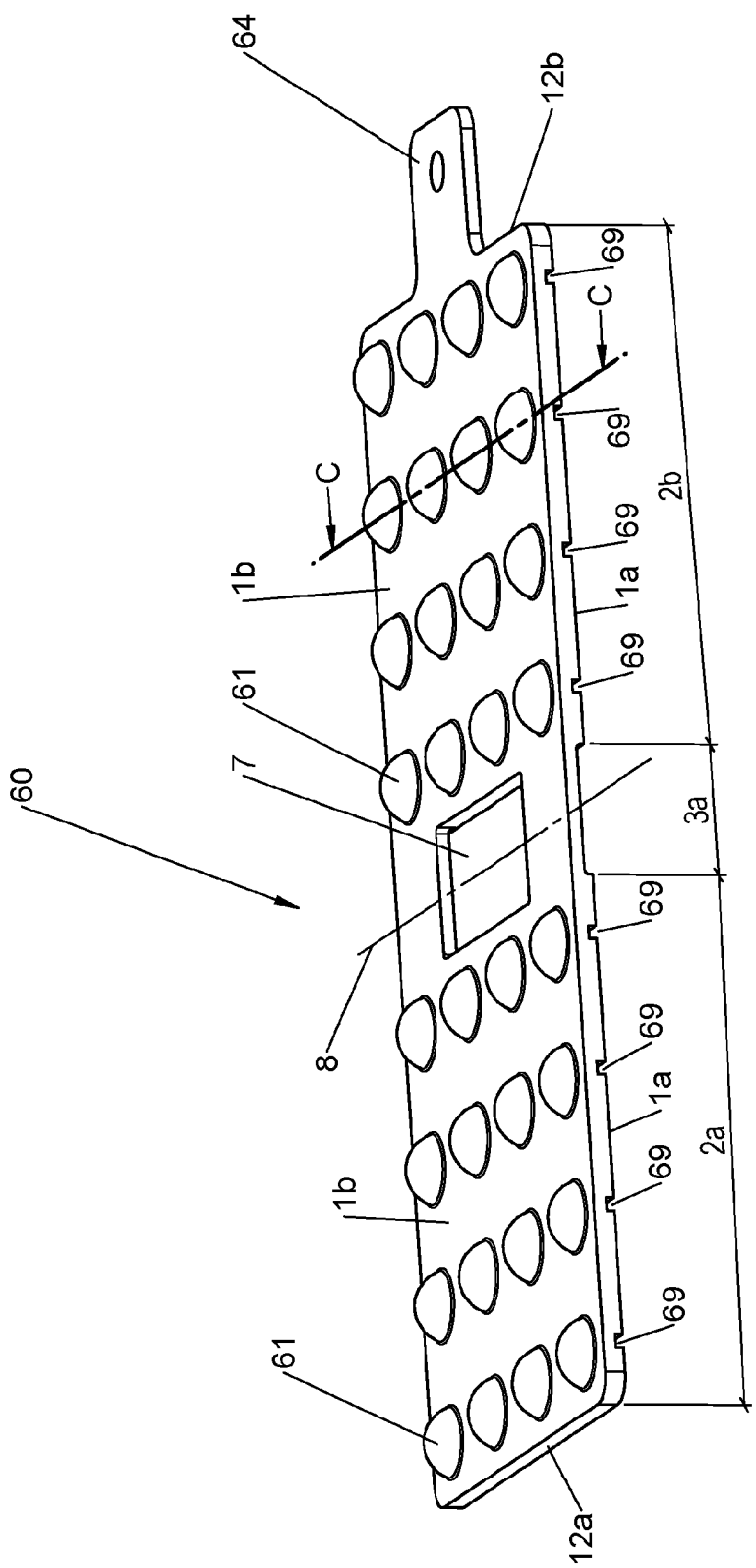

FLEXIBLE CAPACITORS AND METHODS FOR MANUFACTURING FLEXIBLE CAPACITORS

RELATED APPLICATIONS

This application is a national phase of PCT/IB2017/052999, filed on May 22, 2017, which claims the benefit of Swiss Application No. 01089/16, filed on Aug. 25, 2016. The entire contents of these applications are hereby incorporated by reference.

FIELD OF THE INVENTION

The present invention concerns flexible capacitors, and methods of manufacturing flexible capacitors. In particular the present invention concerns flexible capacitors, which can be used for measuring force, and which have a strip having a first and second region each region having nodules, and wherein the strip is folded to sandwich a foil between the first and second regions.

DESCRIPTION OF RELATED ART

Existing flexible capacitors can be complex, and are difficult to manufacture; and the existing methods for manufacturing such flexible capacitors are inadequate and slow.

It is an aim of the present invention to mitigate or obviate at least some of the disadvantages associated with existing flexible capacitors.

BRIEF SUMMARY OF THE INVENTION

According to an aspect of the present invention there is provided a capacitor comprising, a flexible strip comprising a first region having a plurality of nodules and a second region having a plurality of nodules, and wherein the strip further comprises a first flexible portion which is interposed between the first and second regions, and wherein the flexible strip is folded at the first flexible portion so that, the first and second regions overlay one another and the nodules of the first region extend in a direction towards the second region, and the nodules of the second region extend in a direction towards the first region; and wherein the flexible strip comprises electrically conductive material; and a flexible foil which is arranged to be interposed between the first and second regions, and wherein the foil comprises electrically conductive material.

The foil may comprise a core having an electrically conductive coating. For example the foil may comprise a silicon core which has an electrically conductive coating. In another embodiment foil is composed of electrically conductive material.

The flexible strip may comprise, a core having an electrically conductive coating, and wherein insulating coating is further provided on the electrically conductive coating. For example the flexible strip may comprise, a silicon core which has an electrically conductive coating, and wherein insulating coating is further provided on the electrically conductive coating. In another embodiment the flexible strip is composed of electrically conductive material. In a further variation the insulating coating is provided on the foil, instead of on the core of the flexible strip; in this variation Advantageously the capacitor is a simple construction, and can be easily constructed by simply folding the flexible strip to sandwich the foil between the first and second regions.

Preferably the strip is a single strip.

Preferably the flexible foil is sandwiched between the first and second regions.

Preferably the first and second regions are secured to the foil so that the flexible strip is maintained in its folded configuration.

The thickness of the first flexible portion may be less than the thickness of the first and second regions of the strip.

The strip may comprise, a core having an electrically conductive coating, and wherein insulating coating is further provided on the electrically conductive coating. In a further variation the insulating coating may be provided on the foil; for example on the electrically conductive coating of the foil, instead of on electrically conductive coating of the strip. The purpose of the coating of electrically insulating material is to electrically isolate the conductive material of the strip from the conductive material of the foil so that the conductive material of the strip can define a first electrode of the capacitor and the conductive material of the foil can define a second electrode of the capacitor; it is clear that this electrical isolation can be achieved either by having the electrically insulating material on the strip or on the foil so long as the electrically insulating material is interposed between the strip and the foil.

Preferably the material of core of the strip, the coating of insulating material and the coating of electrically conducting material provided on the core of the strip, and the material of the core of the foil and coating of electrically conducting material provided on the core of the foil are each flexible and/or elastic materials. This provides the advantage that the capacitor can be provided in a soft, flexible and stretchable form which can thus follow curved shapes. Therefore, very low cost and simply structured capacitors can be made. Furthermore, the capacitor itself can be shaped in any (mouldable) form.

The foil may comprise an electrical contact which is electrically connected to the electrically conductive coating of the foil. Said electrical contact of the foil can be connected to a PCB board or electrical cable.

The strip may comprise an electrical contact which is electrically connected to the electrically conductive coating of the strip. Said electrical contact of the strip can be connected to a PCB board or electrical cable.

In an embodiment the plurality of nodules in the first region are offset from the plurality of nodules in the second region.

In an embodiment the plurality of nodules in the first region are aligned with the plurality of nodules in the second region.

In an embodiment the single strip further comprises one or more alignment windows provided on opposite sides of an axis along with the flexible strip is folded; and wherein when said alignment windows are aligned so that the first and second regions are in a predefined position with respect to one another.

In an embodiment the perimeters of the first and second regions are aligned so that the first and second regions are in a predefined position with respect to one another.

In an embodiment the flexible strip further comprises a second flexible portion which connects said foil to either the first or second region, and wherein the single strip is folded at the second flexible portion so that the foil is arranged to be interposed between the first and second regions.

Preferably the thickness of the second flexible portion is less than the thickness of the first and second regions of the strip.

Preferably the thickness of the second flexible portion is equal to the thickness of the first flexible portion of the strip.

Preferably said thickness of the first region, second region, first flexible portion and/or the second flexible portion, of the strip, is respectively the minimum thickness in a direction perpendicular to the plane of the strip of the respective first region, second region, first flexible portion and/or the second flexible portion, of the strip.

In an embodiment the plurality of nodules comprise nodules which are substantially incompressible. Preferably each of the plurality of nodules is defined by a solid projection. Preferably the solid projection is a cylindrical projection.

In an embodiment the plurality of nodules comprise nodules which are compressible. Preferably the plurality of nodules comprise nodules which are configured to be dome-shaped. Preferably the plurality of nodules comprise nodules which are configured to be dome-shaped having a concave inner surface and a convex outer surface.

In an embodiment the strip further comprises one or more air channels which are in fluid communication with volume(s) defined by the inner surfaces of one or more nodules, such that when a nodule is compressed, air within the volume defined by the inner surface of that nodule can flow along an air channel. In this manner the air is expelled from the capacitor.

In an embodiment the plurality of nodules comprise nodules which comprise a skirt.

In an embodiment an electrical contact is provided on an inner surface of the skirt. The electrical contact may be referred to as a contact pill.

In one embodiment all of the plurality of nodules of both the first and second regions are each configured to be incompressible. In another embodiment all of the plurality of nodules of both the first and second regions are each configured to be compressible. In another embodiment the nodules of one of first or second regions are each configured to be incompressible, and the nodules of the other of the first or second region are each configured to be compressible.

In an embodiment the nodules provides in the first region are configured to be compressible, and the nodules provided in the second region are configured to be substantially incompressible. In this embodiment preferably the nodules which are compressible comprise a skirt portion and a key top. The skirt portion is preferably configured to collapse inwards upon the application of a force to the nodule. The skirt portion is preferably membrane. Preferably the skirt portion is defined by a dome-shaped membrane.

In an embodiment the foil further comprises a plurality of depressions defined on a first surface thereof and plurality of depressions defined on a second surface thereof which is opposite to the first surface, and wherein at least a portion of each nodule is received into a respective depression.

In an embodiment the foil comprises a reinforcement member which defines a pocket which can receive either the first or second region of the strip. Preferably the first or second region of the strip is positioned in the pocket defined by the reinforcement member. Preferably said first or second region of the strip is secured within pocket by an adhesive or other securing means.

In an embodiment the strip further comprises a frame which is arranged to surround the first or second region of the strip, and wherein the frame defines a pocket which can receive the foil. Preferably the foil is positioned in the pocket defined by the frame. Preferably the foil is secured within pocket by an adhesive or other securing means.

In an embodiment a cut out is provided in the first flexible portion, and wherein a portion of the foil which comprises an electrical contact extends through the cut out.

In an embodiment a cut out is further provided in the second flexible portion.

According to a further aspect of the present invention there is provided a method of making a capacitor according to any one of the preceding claims, the method comprising the steps of, providing a flexible strip comprising a first region having a plurality of nodules and a second region having a plurality of nodules, and wherein the flexible strip further comprises a first flexible portion interposed between the first and second regions;

providing a flexible foil which comprises a core which has an electrically conductive coating;

folding the strip at the first flexible portion so that the first and second regions overlay one another and the nodules in the first region extend in a direction towards the second region, and the nodules in the second region extend in a direction towards the first region, and arranging the foil to be interposed between the first and second regions.

In an embodiment the method further comprises the step of securing the first and second regions to the foil so that the flexible strip is maintained in its folded configuration.

In an embodiment the flexible strip further comprises one or more alignment windows provided on opposite sides of an axis along with the flexible strip is folded; and the method comprises the step of aligning said alignment windows when folding the strip so as to bring the first and second regions into a predefined position with respect to one another.

In an embodiment the method comprises the step of aligning perimeters of the first and second regions so as to bring the first and second regions into a predefined position with respect to one another.

In an embodiment the plurality of nodules comprise nodules which are substantially incompressible, and the method comprises the step of positioning the first and second regions so that the nodules of the first region are offset from the nodules of the second region.

In an embodiment the plurality of nodules comprise nodules which are compressible, and the method comprises the step of positioning the first and second regions so that the nodules of the first region are aligned with the nodules of the second region.

In an embodiment the plurality of nodules comprise nodules which are configured to be dome-shaped, each nodule having a concave inner surface and a convex outer surface, and the method comprises the step of positioning the first and second regions so that the nodules of the first region are aligned with the nodules of the second region.

In another embodiment the nodules of the first region are compressible and the nodules of the second region are substantially incompressible, and the method comprises the step of positioning the first and second regions so that the nodules of the first region are offset from the nodules of the second region.

In an embodiment the foil further comprises a plurality of depressions defined on a first surface thereof and plurality of depressions defined on a second surface thereof, which is opposite to the first surface, and the method comprises the step of positioning the first and second regions and/or the foil so that at least a portion of each nodule is received into a respective depression.

In an embodiment the flexible strip further comprises a second flexible portion which connects said foil to either the first or second regions, and the method further comprises the step of folding the flexible strip at the second flexible portion so that the foil is arranged to be interposed between the first and second regions.

In an embodiment the method further comprises the step of cutting the second flexible portion so as to electrically isolate electrically conductive coating of the foil from electrically conductive coating of the strip.

In an embodiment the foil comprises a reinforcement member which defines a pocket which can receive either the first or second region of the flexible strip, and the method comprises the step of, positioning the first or second region of the strip into the pocket defined by the reinforcement member. Preferably the method further comprises the step of securing said first or second region of the strip within pocket by an adhesive or other securing means.

In an embodiment the strip further comprises a frame which is arranged to surround the first or second region of the strip, and wherein the frame defines a pocket which can receive the foil, and the method comprises the step of, positioning the foil into the pocket defined by the frame. Preferably the method further comprises the step of securing the foil within pocket by an adhesive of other securing means.

In an embodiment the method further comprises the step of, arranging a portion of the foil which comprises an electrical contact so that it extends through a cut out in the first flexible portion of the strip.

In an embodiment the method further comprises the step of providing electrical contacts on the strip which electrically connect to an electrically conductive coating of the strip. Preferably the method further comprises the step of providing electrical contacts in one or more of the alignment windows after on the strip has been folded, which electrically connect to an electrically conductive coating of the strip.

In an embodiment the method further comprises the step of arranging the capacitor onto a PCB board. Preferably the method comprises the step of arranging the capacitor onto a PCB board so that electrical contacts ('pill') which are provided on respective nodules are aligned with electrical contacts on the PCB board or cables provided.

In an embodiment the method comprises the step of attaching one or more electrical contacts which are electrically connected to an electrically conductive coating of the strip, to a PCB board or electrical cable(s), and attaching one or more electrical contacts which are electrically connected to an electrically conductive coating of the foil, to a PCB board or electrical cable(s).

According to a further aspect of the present invention there is provided an assembly comprising a capacitor according to any one the above-mentioned capacitor embodiments, and a button element which a user can press, and wherein the button element is supported on a compressible nodule, and wherein a portion of the button element overlays at least a portion of the first and second regions of the capacitor such that when the button element is pressed to compress the nodule the portion of the button element which overlays the first and second regions of the capacitor contacts the capacitor. The button element can be pushed against the capacitor so cause a change in capacitance of the capacitor.

BRIEF DESCRIPTION OF THE DRAWINGS

The invention will be better understood with the aid of the description of embodiments of the present invention which are given by way of example only, and illustrated by the figures, in which:

FIG. 2 provides a cross sectional view taken along line A-A' of FIG. 1;

FIG. 3b provides a cross sectional view of the foil taken along line B-B' of FIG. 3a;

FIG. 4b provides a side view of the capacitor of FIG. 4a;

FIG. 7 provides a perspective view of a strip which can be used in another embodiment of the present invention;

FIG. 9b provides a cross sectional view of the foil taken along line D-D' of FIG. 9a;

DETAILED DESCRIPTION OF POSSIBLE EMBODIMENTS OF THE INVENTION

According to an aspect of the present invention there is provided capacitor and a method of manufacturing a capacitor; the capacitor of the present invention may be used in a capacitive sensor which is suitable for measuring force.

Figure 1:
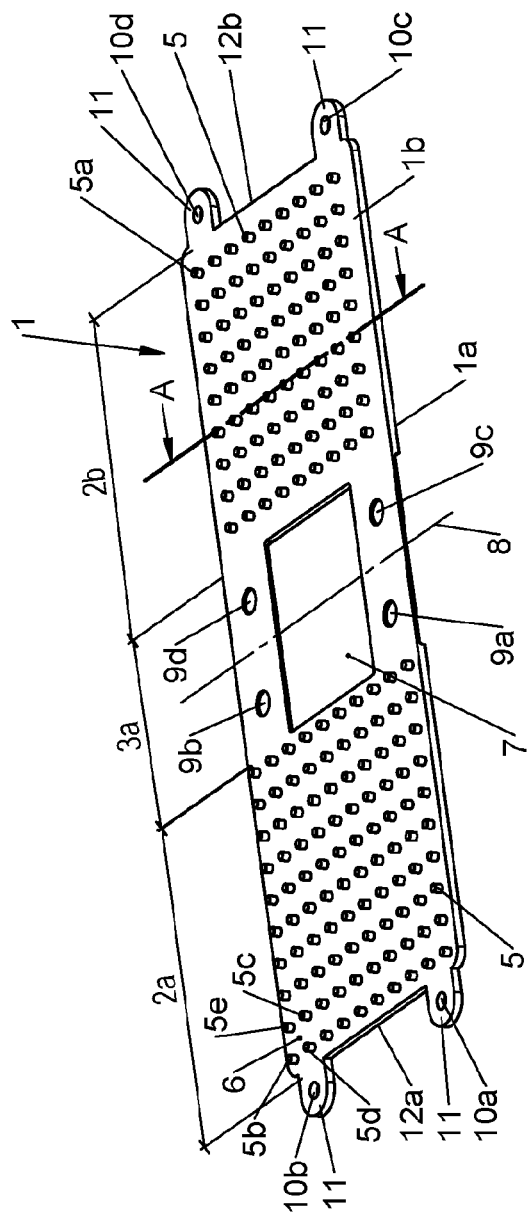
FIG. 1 provides a perspective view of a strip which can be used in an embodiment of the present invention.

In an embodiment there is first provided a strip 1. FIG. 1 provides a perspective view of an example of a strip 1 which could be used in an embodiment of the present invention. The strip 1 comprises a first surface 1a and a second surface 1b which is opposite to the first surface 1a.

The strip 1 comprises a first region 2a having a plurality of nodules 5 and a second region 2b having a plurality of nodules 5. It should be understood that the nodules 5 may have any suitable profile; in this example the nodules 5 are cylindrical shaped. Also in this example the nodules 5 are substantially rigid; in this embodiment the nodules 5 are configured to each have a Young's modulus of 20 N/mm². The nodules 5 may be configured to have a Young's modulus of any value, however preferably the nodules 5 are configured to have a Young's modulus of between 1-100 N/mm², preferably 0.3-30 N/mm².

A first flexible portion 3a is interposed between the first and second regions 2a,2b. The first flexible portion 3a is designed such as to allow the strip 1 to be folded at this section so that the first and second regions 2a,2b can be moved to overlay one another. Preferably an axis 8, which is parallel to the plane of the strip 1, and which extends across the first flexible portion 3a, defines a fold line 8 along which the strip 1 is to be folded. Typically, but not always, the axis 8 will be positioned to bisect the length of the first flexible portion 3a.

The first and second regions 2a,2b, the nodules 5 and the flexible portion 3a all have the same material composition. However the thickness (in a direction perpendicular to the plane of the strip 1) of first flexible portion 3a is less than the thickness (in a direction perpendicular to the plane of the strip 1) of the regions of the first and second regions 2a,2b, which are without nodules, thus making it easier to fold the strip 1 in first flexible portion 3a. Preferably, the strip 1 is formed of a single moulded piece. In this embodiment the first flexible portion 3a further comprises a cut-out 7 which reduces the amount of material present in the first flexible portion 3a, which further increases the flexibility of the first flexible portion 3a. However it will be understood that the cut-out 7 is an optional feature.

In another embodiment the material composition of the first and second regions 2a,2b, and nodules 5 is different to the material composition of the flexible portion 3a; in such an embodiment the regions of the first and second regions 2a,2b which are without nodules, and the flexible portion 3a may all have equal thicknesses, but the first flexible portion 3a may be composed of material which is more flexible than the material of the first and second regions 2a,2b, thus making it easier to fold the strip 1 at the first flexible portion 3a.

Referring again to the strip 1 shown in FIG. 1, the strip 1 further comprises at least one alignment window provided on one side of the axis 8 and a corresponding alignment window(s) provided on the opposite side of the axis 8. In the example illustrated in FIG. 1 the strip 1 comprises eight alignments windows 9a-d and 10a-d. Alignment windows 9a-d are defined by respective apertures in the first flexible portion 3a and alignment windows 10a-d are defined by apertures provided in flaps 11 which extend at opposing end extremities of the strip 1. The alignment windows 9a,b, 10a,b are located on one side of the axis 8 and the corresponding alignment windows 9c,d, 10c,d are located on the opposite side of the axis 8. It should be understood that any number of alignment windows may be provided.

The alignment windows aid correct positioning of the first and second regions 2a,2b with respect to one another when the strip 1 is folded at the first flexible portion 3a. The alignment windows 9a-d and 10a-d are positioned such that when the strip 1 is folded, and the alignment windows 9a,b, 10a,b located on one side of the axis 8 are aligned with the corresponding alignment windows 9c,d, 10c,d located on the opposite side of the axis 8, then the first and second regions 2a,2b will have a predefined position with respect to one another.

In another embodiment only alignment windows 9a-d defined by respective apertures in the first flexible portion 3a are provided. In yet another embodiment only the alignment windows 10a-d defined by apertures provided in flaps 11 at opposing end extremities of the silicone strip 1 are provided.

It should be understood that the alignment windows 9a-d, 10a-d are optional features; the provision of alignment windows is not essential for the invention. Thus in a further embodiment no alignment windows are provided. In such an embodiment typically the perimeters 12a, 12b of the respective first and second regions 2a, 2b are used to aid correct positioning of the first and second regions 2a,2b with respect to one another when the strip 1 is folded: When folding the strip 1 the perimeters 12a, 12b of the respective first and second regions 2a,2b are aligned; once the perimeters 12a, 12b are aligned then first and second regions 2a,2b will have a predefined, desired, position with respect to one another.

Importantly, in the strip 1 illustrated in FIG. 1, the positions of the plurality of nodules 5 in the first region 2a do not correspond to the positions of the plurality of nodules 5 in the second region 2b. On the contrary the positions of the plurality of nodules 5 in the first region 2a are such that when the strip 1 is folded at the first flexible portion 3a, and the respective alignment windows 9a-d and 10a-d aligned and/or the respective perimeters 12a,12b aligned, the nodules 5 in the first region 2a will be offset from the nodules 5 in the second region 2b. Most preferably the nodules 5 in the first region 2a will have a predefined position with respect to the nodules 5 in the second region 2b. In the preferred embodiment when the strip 1 is folded at the first flexible portion 3a, and the respective alignment windows 9a-d and 10a-d aligned and/or the respective perimeters 12a,12b are aligned, each respective nodule 5 of the second region 2b will be positioned above a centre point between four adjacent nodules 5 of the first region 2a; for example the nodule 5a in the second region 2b will be positioned above the centre point 6 between the four adjacent nodules 5b-e in the first region 2a.

Furthermore, once the strip 1 has been folded and the alignment window 9a,c have been aligned with one another and the alignment window 9b,d have been aligned with one another, respective electrical contacts may be inserted through the alignment windows 9a,c and the alignment windows 9b,d.

FIG. 2 provides a cross section of a strip 1 taken along A-A' of FIG. 1. As shown in FIG. 2 the strip 1 comprises a core 18 composed of any suitable material. Preferably the core comprises a flexible and/or elastic material; for example said core 18 may comprise one or more of, Silicone, elastomeric material, natural and synthetic rubber materials (Nitrile butadiene rubber NBR, Hydrogenated nitrile butadiene rubber HNBR, Chloroprene rubber, ethylene propylene diene monomer rubber EPDM, Polyurethane, and/or Polyacrylate). The core 18 may comprise elastic fibers and/or elastic cloth. In this example the core 18 is composed of Silicone. The Silicone core 18 comprises a first surface 19a which is profiled to define the nodules 5, and a second surface 19b, which is opposite to the first surface 19a and which is flat.

A coating of electrically conductive material 15 is provided on the first surface 19a of the silicone core 18. Preferably the coating of electrically conductive material 15 is also flexible and/or elastic, so that the strip 1 is flexible. The electrically conductive material 15 may have any suitable composition; preferably the electrically conductive material 15 comprises at least one of: carbon particles such as Carbon Black, Graphene, Fullerenes, Nanotubes; and/or metallic particles such as flakes and/or nanowires of Silver, Gold, Tungsten and/or Nickel; and/or semiconducting particles such as Silicon, Indiumphosphid and Galliumnitride particles; and/or conductive polymers such as Poly-3,4-ethylendioxythiophen (PEDOT, PEDT), Polyethin (or Polyacetylen, PAC), Polyanilin (PAni), Polyparaphenylen (PPP), Polythiophen (PT) and/or Polypyrrol (PPy). The electrically conductive material 15 may comprise conductive fibres and/or a conductive cloth, which may comprise metal and/or conductive polymer(s). It should be noted that in this example the electrically conductive material 15 is provided only on the first surface 19a of the silicone core 18 (it is not provided on the second surface 19b of the silicone core 18; however in another embodiment the electrically conductive material 15 is also provided on the second surface 19b of the silicone core 18).

A coating of electrically insulating material 16 is further provided on the coating of electrically conductive material 15. A coating of electrically insulating material 16 is further preferably provided on the second surface 19b of the silicone core 18, and preferably is also provided on side surfaces 17a,b of the silicone core 18 so that all exposed surfaces of the silicone core 18 are coated within the electrically insulating material 16. Thus in this particular embodiment the first surface 1a and the second surface 1b of the strip 1 shown in FIG. 1, are each defined by the electrically insulating material 16. Preferably the coating of electrically insulating material 16 is also flexible and/or elastic material so that the strip 1 is flexible. Preferably the electrically insulating material 16 may comprise any suitable electrically insulating material; preferably the electrically insulating material 16 comprises at least one of Polyurethane, natural and/or synthetic rubber, Silicone, Polyacrylate. The coating of electrically insulating material 16 may comprise electrically insulating fibers and/or electrically insulating cloth.

It is pointed out that the use of flexible and/or elastic materials for the core 18, the coating of electrically conductive material 15, and the coating of electrically insulating material 16, provides the advantage that the strip 1 is in a soft, flexible and stretchable form, and which can thus be formed into curved shapes. Therefore, very low cost and simply structured capacitors can be made. Furthermore, the capacitor itself can be flexed to shape it into any desirable shape or form.

Figure 3A:
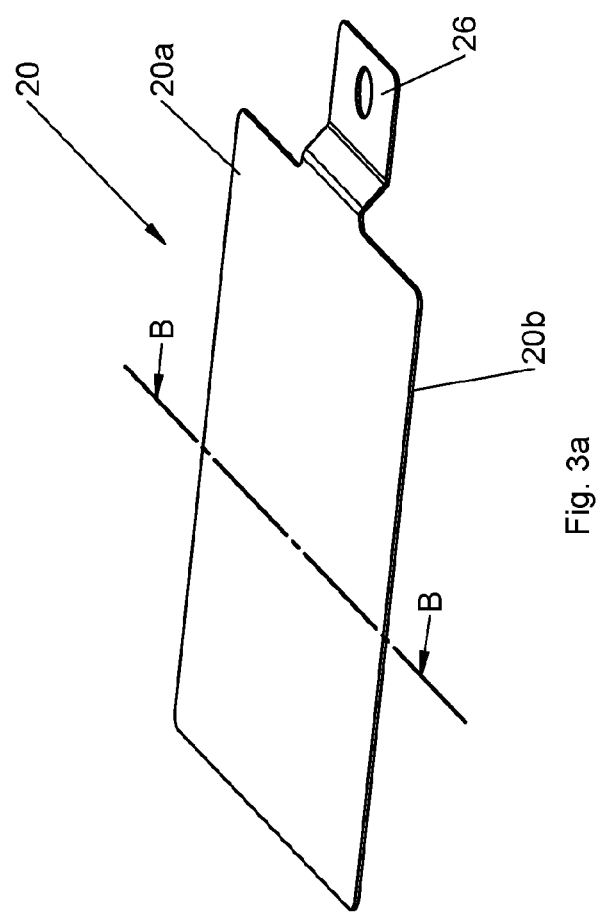
FIG. 3a provides a perspective view of a foil which can be used in an embodiment of the present invention.
Figure 3B:
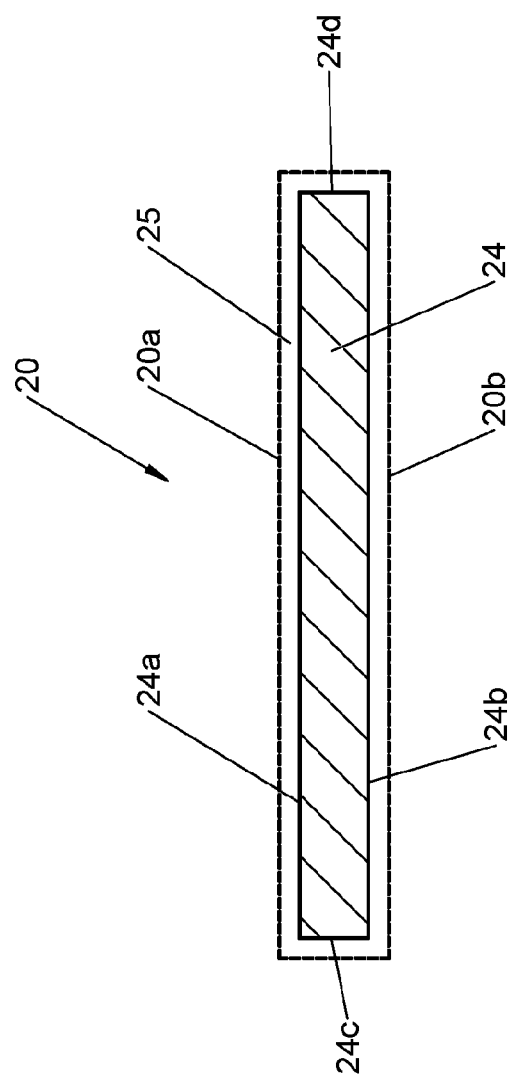

Referring now to FIGS. 3a & b; FIG. 3a provides a perspective view of a foil 20 which could be used in an embodiment of the present invention; FIG. 3b provides a cross sectional view taken along B-B' of FIG. 3a.

The foil 20 comprises a first surface 20a, and a second surface 20b which is opposite to the first surface 20a. The foil 20 comprises core 24 composed of any suitable material which is preferably flexible and/or elastic; for example said core 24 may comprise one or more of, Silicone, elastomeric material, natural and synthetic rubber materials (NBR, HNBR, CR, EPDM), Polyurethane, and/or Polyacrylate. The core 24 may comprise elastic fibers and/or elastic cloth. In this example the core 24 is composed of Silicone. The silicone core 24 has a first surface 24a and a second surface 24b which is opposite to the first surface 24a; both the first and second surfaces 24a, 24b are flat/even over the whole surface. In this embodiment the foil 20 is configured to have a Young's modulus of 15 $N/mm^2$. Thus the foil 20 has a degree of elasticity which enables it to be stretched manually by the application of a force by a user. It should be understood that the foil 20 could be configured to have any Young's modulus value; preferable the foil 20 is configured to have any Young's modulus value in the range 1-100 $N/mm^2$, and preferably in the range 0.3-30 $N/mm^2$ 0.3-30 $N/mm^2$.

The silicone core 24 of has a coating of electrically conductive material 25. Preferably the coating of electrically conductive material 25 is flexible and/or elastic so that the foil 20 is flexible. The coating of electrically conductive material 25 is provided on both the first and second surfaces 24a, 24b of the silicone core 24, and also on side surfaces 24c,d of the silicone core 24 so that all surfaces of the silicone core 24 are coated with said electrically conductive material 25 (i.e. the silicone core 24 is completely covered by the electrically conductive material 25). The electrically conductive material 25 may have any suitable composition; preferably the electrically conductive material 25 comprises at least one of: carbon particles such as Carbon Black, Graphene, Fullerenes, Nanotubes; and/or metallic particles such as flakes and/or nanowires of Silver, Gold, Tungsten and/or Nickel; and/or semiconducting particles such as Silicon, Indiumphosphid and Galliumnitride particles; and/or conductive polymers such as Poly-3,4-ethylendioxythiophen (PEDOT, PEDT), Polyethin (or Polyacetylen, PAC), Polyanilin (PAni), Polyparaphenylen (PPP), Polythiophen (PT) and/or Polypyrrol (PPy). The electrically conductive material 25 may comprise conductive fibres and/or a conductive cloth, which may comprise metal and/or conductive polymer(s) . . . . The first and second surfaces 20a,20b of the foil 20 are therefore defined by the electrically conductive material 25.

The foil 20 further comprises an electrical contact 26 which can, for example, be electrically connected to a PCB and/or to an electrical cable. Importantly the electrical contact 26 is also in electrical contact with the electrically conductive material 25.

In a method according to an embodiment of the present invention, for manufacturing a capacitor according to an embodiment of the present invention, there is provided a strip 1 as shown in FIGS. 1 and 2 and a foil 20 as shown in FIGS. 3a and 3b.

The foil 20 is positioned to overlay the first region 2a of the strip 1 and the strip 1 is then folded at the first flexible portion 3a, so as to move the second region 2b of the strip 1 to overlay the first region 2a, thereby sandwiching the foil 20 between the first and second regions 2a,2b. Of course it will be understood that alternatively the foil 20 may be positioned to overlay the second region 2b of the strip 1 and the strip 1 is then folded at the first flexible portion 3a, so as to move the first region 2a of the strip 1 to overlay the second region 2b, thereby sandwiching the foil 20 between the first and second regions 2a,2b. In yet a further variation, first the strip 1 is folded at the first flexible portion 3a, so as to move the second region 2b of the strip 1 to overlay the first region 2a (or so as to move the first region 2a of the strip 1 to overlay the second region 2b), and then only after the strip 1 has been folded is the foil then inserted between the first and second regions 2a,b of the folded strip 1 so that the foil 20 is sandwiched between the first and second regions 2a,2b. Thus there are a number of variations in which the method can be performed, however each variation includes a step of folding the strip 1 at the first flexible region 3a; and in each variation the foil 20 is sandwiched between the first and second regions 2a,2b of the strip 1.

During the method, when folding the strip 1, the alignment windows 9*a-d*, 10*a-d* and/or the perimeters 12*a*,12*b* of the first and second regions 2*a*,2*b* are preferably used to achieve a predefined relative positioning between the first and second regions 2*a*,2*b*. Thus in an embodiment the method will preferably comprise the steps of moving the first and second regions 2*a*,2*b*, preferably as the strip 1 is being folded, so that the alignment windows 9*a,b*, 10*a,b* located on one side of the axis 8 are aligned with the corresponding alignment windows 9*c,d*, 10*c,d* located on the opposite side of the axis 8. When the respective alignment windows are aligned then the first and second regions 2*a*,2*b* will have a predefined position with respect to one another. In another embodiment the method may comprise the steps of moving the first and second regions 2*a*,2*b*, preferably as the strip 1 is being folded, so that the perimeters 12*a*, 12*b* of the respective first and second regions 2*a*, 2*b* become aligned; once the perimeters 12*a*, 12*b* are aligned then first and second regions 2*a*,2*b* will have a predefined position with respect to one another.

After the strip 1 has been folded at the first flexible region 3*a* to sandwich the foil between the first and second regions 2*a*, 2*b* of the strip 1, and the alignment windows 9*a,b*, 10*a,b* (and/or perimeters 12*a*,12*b*) have been aligned, the second region 2*b* of the strip 1 is secured (using any suitable securing means, preferably using adhesive such as glue) to the first surface 20*a* of the foil 20, and the first region 2*a* of the strip 1 is secured (using any suitable securing means, preferably using adhesive such as glue) to the second surface 20*b* of the foil 20 in order to maintain the strip 1 in its folded configuration, and to maintain the first and second regions 2*a*,2*b* said predefined position with respect to one another and to maintain the foil 20 in a fixed predefined position between first and second regions 2*a*, 2*b*, Accordingly the method may further comprise the steps of applying adhesive (such as glue) to the foil 20 and/or to the first and second regions 2*a*,2*b*.

Furthermore, after the strip 1 has been folded respective electrical contacts may be provided in the alignment windows 9*a-d* to electrically contact the electrically conductive material 15 the first surface 19*a* of the silicone core 18 of the strip 1. In this example one electrical contact is arranged to extend through the pair of alignment windows 9*a,c* and another electrical contact is arranged to extend through the pair of alignment windows 9*b,d*. Said electrical contacts each electrically contact the electrically conductive material 15 the first surface 19*a* of the silicone core 18 of the strip 1, when they are arranged to extend through their respective pairs of alignment windows 9*a,c* and 9*b,d*.

Figure 4A:
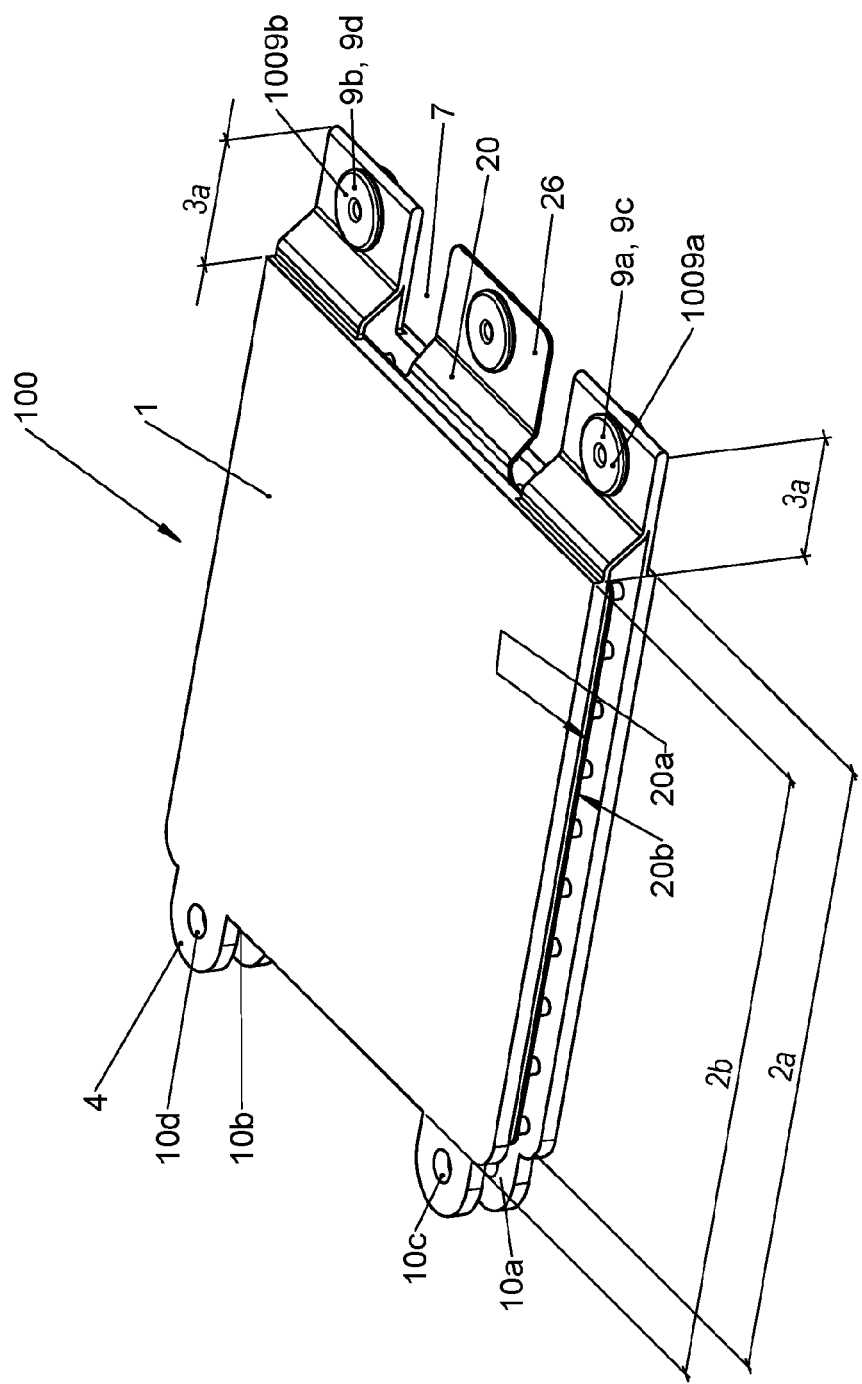
FIG. 4a provides a perspective view of a capacitor formed using the strip of FIGS. 1 and 2 and the foil of FIGS. 3a,b.

FIG. 4*a* provides a perspective view of a capacitor according to an embodiment of the present invention, which results when the above-mentioned method steps have been performed. As shown in FIG. 4*a* the strip 1 is folded at the first flexible portion 3*a*, so that the second region 2*b* of the strip 1 overlays the first region 2*a*; and the foil 20 is sandwiched between the first and second regions 2*a*,2*b*. The first and second regions 2*a*,2*b* have been moved relative to one another during the folding of the strip 1 so that the alignment windows 9*a,b*, 10*a,b* located on one side of the axis 8 are aligned with the corresponding alignment windows 9*c,d*, 10*c,d* located on the opposite side of the axis 8, so in the strip's 1 folded configuration the first and second regions 2*a*,2*b* have a predefined position with respect to one another. The second region 2*b* of the strip 1 is secured (using any suitable securing means, preferably using adhesive such as glue) to the first surface 20*a* of the foil 20, and the first region 2*a* of the strip 1 is secured (using any suitable securing means, preferably using adhesive such as glue) to the second surface 20*b* of the foil 20 in order to maintain the strip 1 in its folded configuration, and to maintain the first and second regions 2*a*,2*b* said predefined position with respect to one another, and to maintain the foil 20 in a fixed predefined position between first and second regions 2*a*, 2*b*.

FIG. 4*a* also illustrates a first electrically contact 1009*a* (e.g. a metallic solder contact) which extends through the pair of alignment windows 9*a,c* and which is in electrical contact with the electrically conductive material 15 the first surface 19*a* of the silicone core 18 of the strip 1; and a second electrical contact 1009*b* (e.g. a metallic solder contact) is arranged to extend through the pair of alignment windows 9*b,d* and which is in electrical contact with the electrically conductive material 15 the first surface 19*a* of the silicone core 18 of the strip 1. The first and second electrically contacts 1009*a*, 1009*b* may each be electrically connected to a PCB and/or to an electrical cable. It will be understood that it is not essential to provided two electrical contacts 1009*a*,1009*b*; one single electrical contact would suffice; but it is important that the electrical contact is in electrical contact with the electrically conductive material 15.

FIG. 4*a* also illustrates a further function for the cut-out 7 which is provided in the first flexible portion 3*a*. As illustrated in FIG. 4*a*, the electrical contact 26 of the foil 20 extends through the cut-out 7 making it available for connection to a PCB board and/or an electrical cable.

Figure 4B:
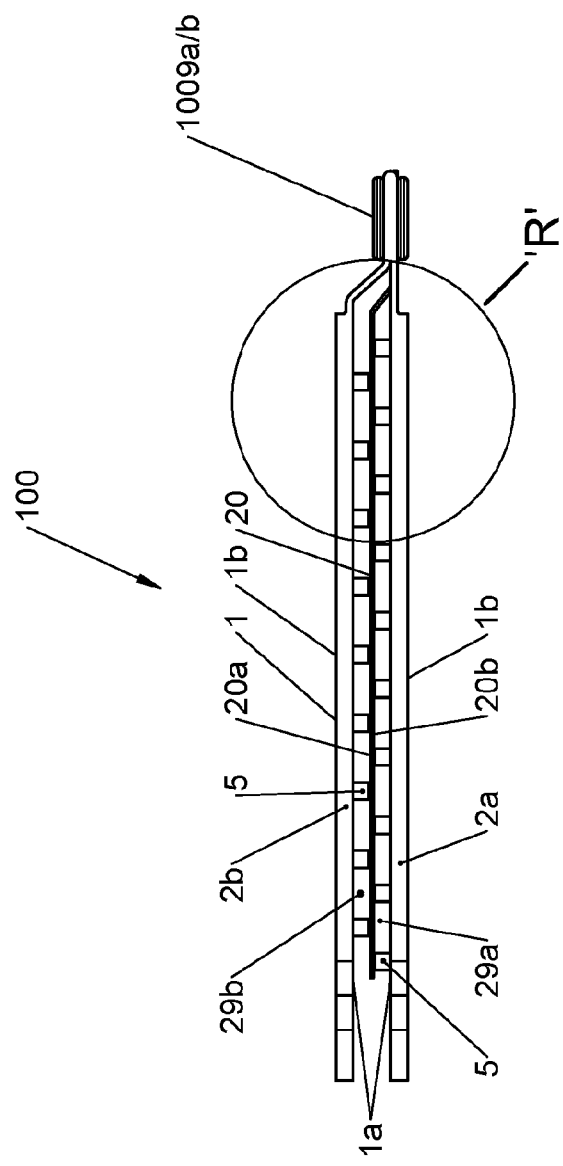
Figure 4C:
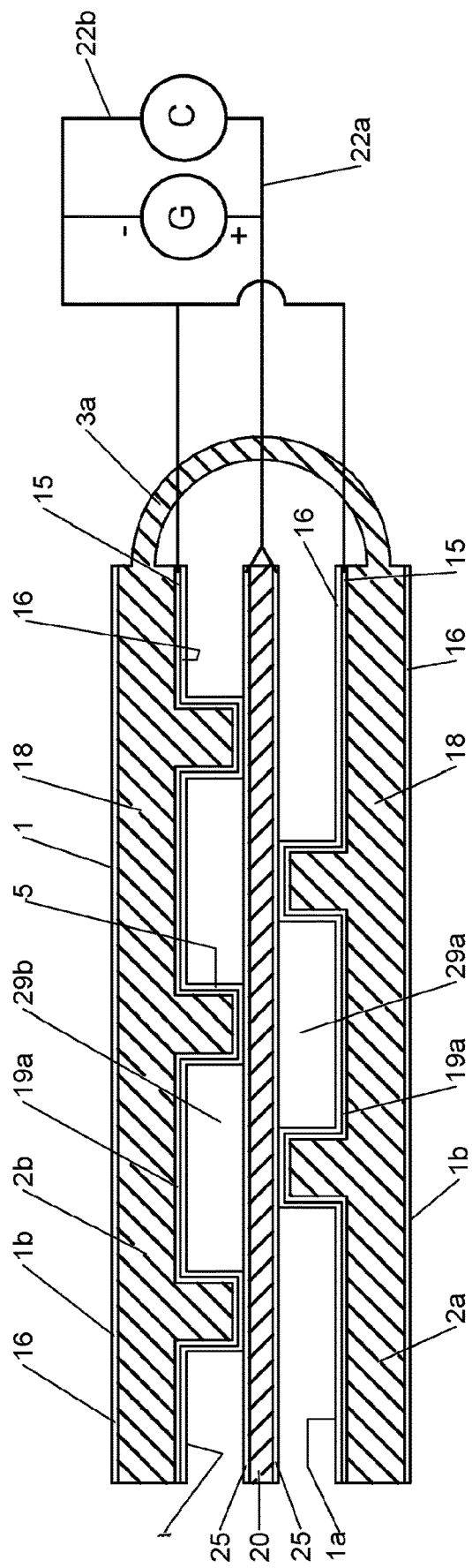
FIG. 4c provides a magnified cross sectional view of the region R of FIG. 4b.

FIG. 4*b*, provides a cross sectional view of the capacitor 100 of FIG. 4*a*; and FIG. 4*c* provides a magnified view of the region "R" in FIG. 4*b*. As can been seen in FIGS. 4*b* and 4*c* the foil 20 is sandwiched between the first and second regions 2*a*,2*b* of the strip 1 when the strip 1 is folded at the first flexible portion 3*a*. The perimeters 12*a*, 12*b* of the respective first and second regions 2*a*,2*b* are shown to also come into alignment, when the alignment windows 9*a,b*, 10*a,b* located on one side of the axis 8 are aligned with the corresponding alignment windows 9*c,d*, 10*c,d* on the opposite side of the axis 8. FIG. 4*b* also illustrates that the nodules 5 of the first region 2*a* are offset from the nodules 5 of the second region 2*b*; since the nodules 5 in this embodiment are rigid, the off-set positioning of the nodules 5 of the first and second regions 2*a*,2*b* allows for the first region 2*a* to be moved towards the second region 2*b*. In particular the nodules 5 of the second region 2*b* can be received into spaces 29*a* which are between the nodules 5 of the first region 2*a*, and the nodules 5 of the first region 2*a* can be received into spaces 29*b* which are between the nodules 5 of the second region 2*b*, thus allowing the first and second regions 2*a*,2*b* to be selectively moved towards each other.

As illustrated in FIG. 4*c* the electrically conducting coating 25 on the foil 20 defines one electrode of a capacitor, and the electrically conducting coating 15 provided on the a first surface 19*a* of the silicone core 18 defines the other electrode of said capacitor; FIG. 4*c* represents this schematically by way of an first electrical line 22*a* which connects the conducting coating 25 on the foil 20 to a display (C) and a second electrical line 22*b* which connects the electrically conducting coating 15 provided on the a first surface 19*a* of the silicone core 18 to the display (C). The display (C) outputs the level of capacitance.

Figure 4D:
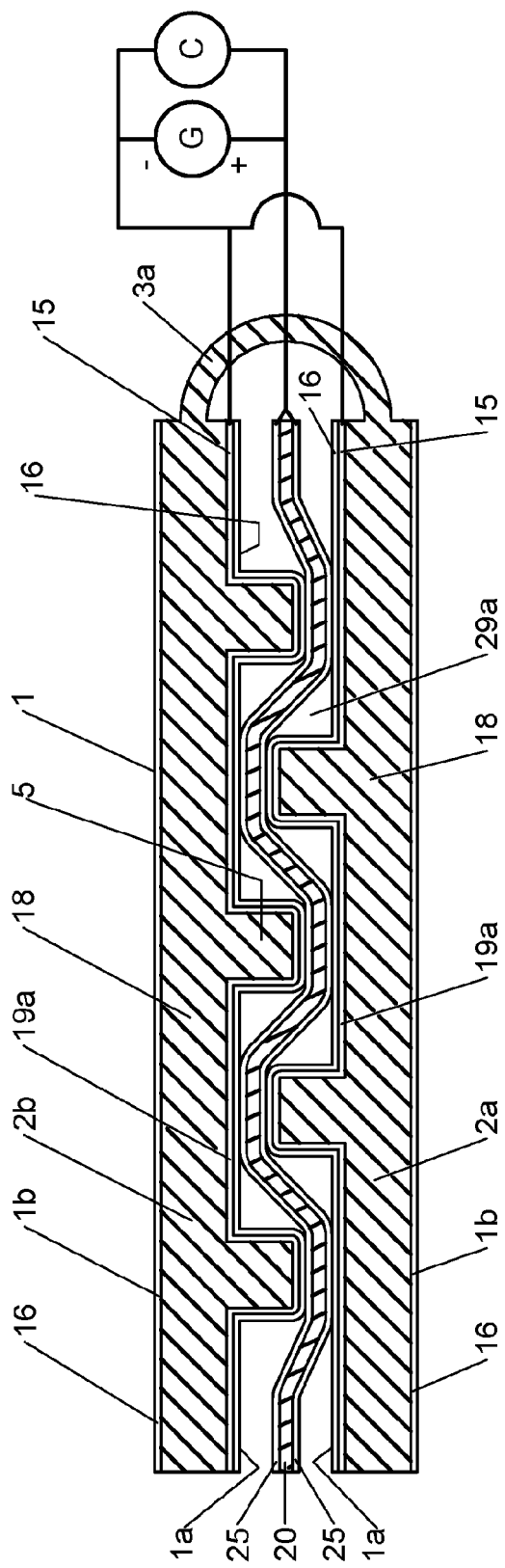
FIG. 4d provides a magnified cross sectional view of the region R of FIG. 4b when a force is applied to move the second region towards the first region (or vice versa)

During use of the capacitor 100, one may apply a force (e.g. a push force) to the exposed surface 1*b* of the strip 1; the force will move the second region 2*b* in the direction towards the first region 2*a*; as the second region 2*b* moves towards the first region 2*a* the nodules 5 of the second region 2*b* will push the foil 20 into spaces 29*a* which are between the nodules 5 of the first region 2a; likewise the nodules 5 of the first region 2a will push the foil 20 into spaces 29b which are between the nodules 5 of the second region 2b, as is illustrated in FIG. 4d; this causes the foil 20 to stretch.

The stretching of the foil 20 increases the area of the foil 20 thus increasing the area of the electrically conducting coating 25, which causes an increase in the capacitance. The stretching of the foil 20 also reduces the distance between the electrically conducting coating 25 on the foil 20 and the electrically conducting coating 15 on the first surface 19a of the silicone core 18 (i.e. the distance between the components which define electrodes of a capacitor is reduced), which causes an increase in the capacitance. The level of capacitance increases with increasing force applied since with increasing force the foil 20 becomes more stretched to further increase the area of the foil 20, and, further reduce the distance between the electrically conducting coating 25 on the foil 20 and the electrically conducting coating 15 on the a first surface 19a of the silicone core 18. It should be noted that when the force (e.g. a push force) which was applied to the exposed surface 1b of the strip 1 is released, then the second region 2b (and first region 2a) and the foil 20 will each electrically return back to their original positions.

A change in capacitance may be detected using techniques known in the art. For example, since capacitors resist a change in voltage, the capacitance can be indirectly measured through an applied voltage. By applying a voltage to the capacitor 100 and comparing the actual voltage output to what would be expected without a capacitor 100, the capacitance of the capacitor 100 can be determined. The capacitance of the capacitor 100 can be correlated with the force applied to the exposed surface 1b of the strip 1, thus allowing the capacitor 100 to be used as a force sensor.

In another embodiment electrically conducting material is provided only on opposite first and second surfaces 24a 24b of the core 24 of the foil (i.e. no electrically conducting material is provided on side surfaces 24c,d of the core 24; and no electrically conducting material is provided on the silicone core 18 of the strip 1). In this other embodiment the electrically conducting material provided on the first surface 24a of the core 24 defines one electrode of a capacitor, and the electrically conducting material provided on the second surface 24b of the core 24 defines the other electrode of said capacitor. During use one may apply a force (e.g. a push force) to the exposed surface 1b of the strip 1; the force will move the second region 2b in the direction towards the first region 2a; as the second region 2b moves towards the first region 2a the nodules 5 of the second region 2b will push the foil into spaces 29a between the nodules 5 of the first region 2a, likewise the nodules 5 of the first region 2a will push the foil 20 into spaces 29b between the nodules 5 of the second region 2b; this causes the foil to stretch. The stretching of the foil increases the area of first and second surfaces 24a 24b, thus increasing the area of the electrically conducting material provided on the first surface 24a (which defines one electrode of a capacitor) and the area of electrically conducting material provided on the second surface 24b (which defines the other electrode of the capacitor), which in turn causes an increase in the capacitance. The stretching of the foil also reduces the thickness of the foil thus, when the foil is stretched the distance between the electrically conducting material provided on the first surface 24a (which defines one electrode of a capacitor) and the electrically conducting material provided on the second surface 24b of the foil (which defines the other electrode of the capacitor) is reduced, which in turn causes an increase in the capacitance. The level of capacitance increases with increasing force applied since with increasing force the foil becomes more stretched to increase further the area of the electrically conducting material provided on the first and second surfaces 24a,24b, and to reduce further the thickness of the foil, thus further reducing the distance between the electrically conducting material on the first and second surfaces 24a, 24b.

Figure 5:
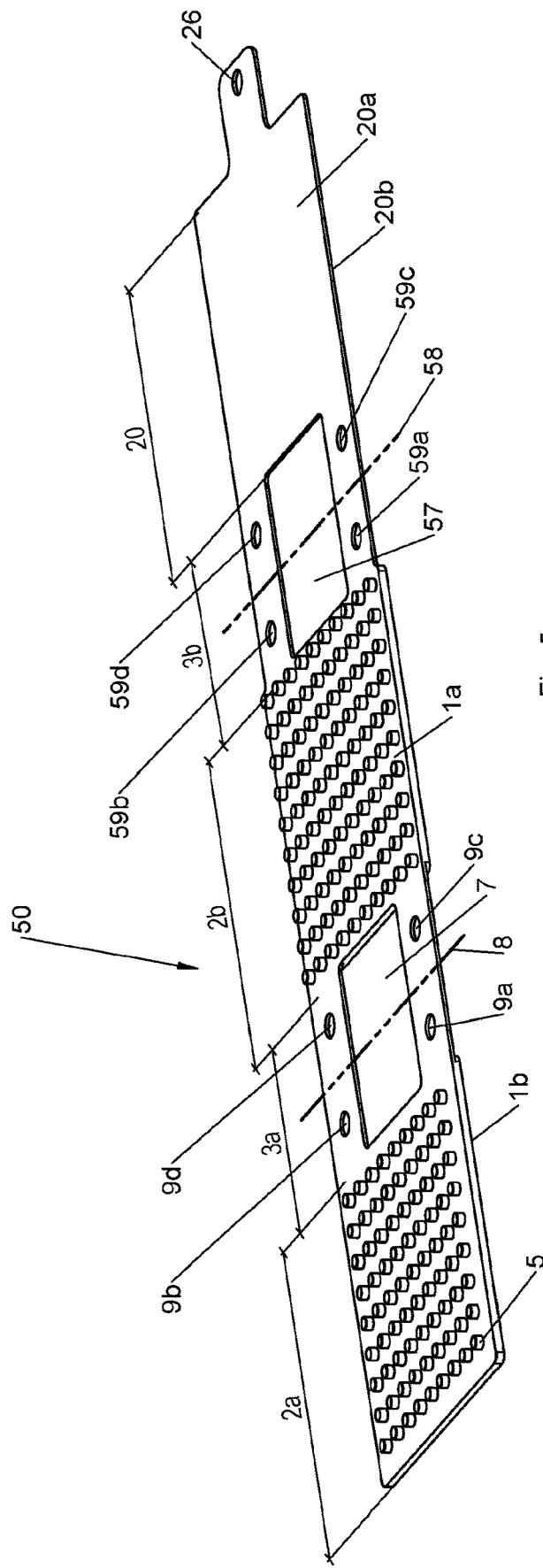
FIG. 5 provides a perspective view of a strip which can be used in another embodiment of the present invention.

FIG. 5 shows a perspective view of another strip 50 which could be used in another embodiment of the present invention. The strip 50 comprises many of the same features of the strip 1 shown in FIG. 1 and like features are awarded the same reference numbers. However in this embodiment the foil 20 is integral to the strip 50. Specifically the strip 50 further comprises a second flexible portion 3b which connects the foil 20 to the second region 2b. It should be understood that in a further variation of this embodiment the second flexible portion 3b is arranged to connect the foil 20 to the first region 2a. The foil 20 has many of the same features of the foil 20 shown in FIGS. 3a,3b and like features are awarded the same reference numbers.

In this example the second flexible portion 3b is designed such as to allow the strip 50 to be folded at this section, so that the foil 20 can be moved to overlay the second region 2b. (It will be understood that if the second flexible portion 3b connects the foil 20 to the first region 2a, then it will be designed such as to allow the strip 50 to be folded at this section so that the foil 20 can be moved to overlay the first region 2a).

Preferably an axis 58, which is parallel to the plane of the strip 1, and which extends across the second flexible portion 3b, defines a fold line 58 along which the strip 50 is to be folded. Typically, but not always, the axis 58 will be positioned to bisect the length of the second flexible portion 3b.

The thickness (in a direction perpendicular to the plane of the strip 50) of second flexible portion 3b is less than the thickness (in a direction perpendicular to the plane of the strip 50) of the first and second regions 2a,2b in regions of the first and second regions 2a,2b which are without nodules, thus making it easier to fold the strip 50 at the second flexible portion 3b. Preferably the strip 50 is formed of a single moulded piece. In this embodiment the second flexible portion 3b further comprises a cut-out 57 which reduces the amount of material in the second flexible portion 3b, which further increases the flexibility of this portion. However it will be understood that the cut-out 57 is an optional feature.

In another embodiment the material composition of the first and second regions 2a,2b, and the material composition of the foil 20, is different to the material composition of the second flexible portion 3b; in such an embodiment the regions of the first and second regions 2a,2b which are without nodules, and the second flexible portion 3b, may all have equal thickness (in a direction perpendicular to the plane of the strip 50), but the second flexible portion 3b may be composed of material which is more flexible than the material of the first and second regions 2a,2b, and material of the foil 20, thus making it easier to fold the strip 1 at the second flexible portion 3b.

The second flexible portion 3b further comprises alignment windows 59a-d, which can be used in a similar fashion to alignment windows 9a-d to achieve a predefined alignment of the foil 20 with respect to the second region 2b (or first region 2a, if the second flexible portion 3b connects the foil 20 to the first region 2a) when the strip 50 is folded at the second flexible portion 3b.

In a further embodiment of a method for manufacturing a capacitor according to the present invention, there is provided a strip 50 as shown in FIG. 5.

Figure 6A:
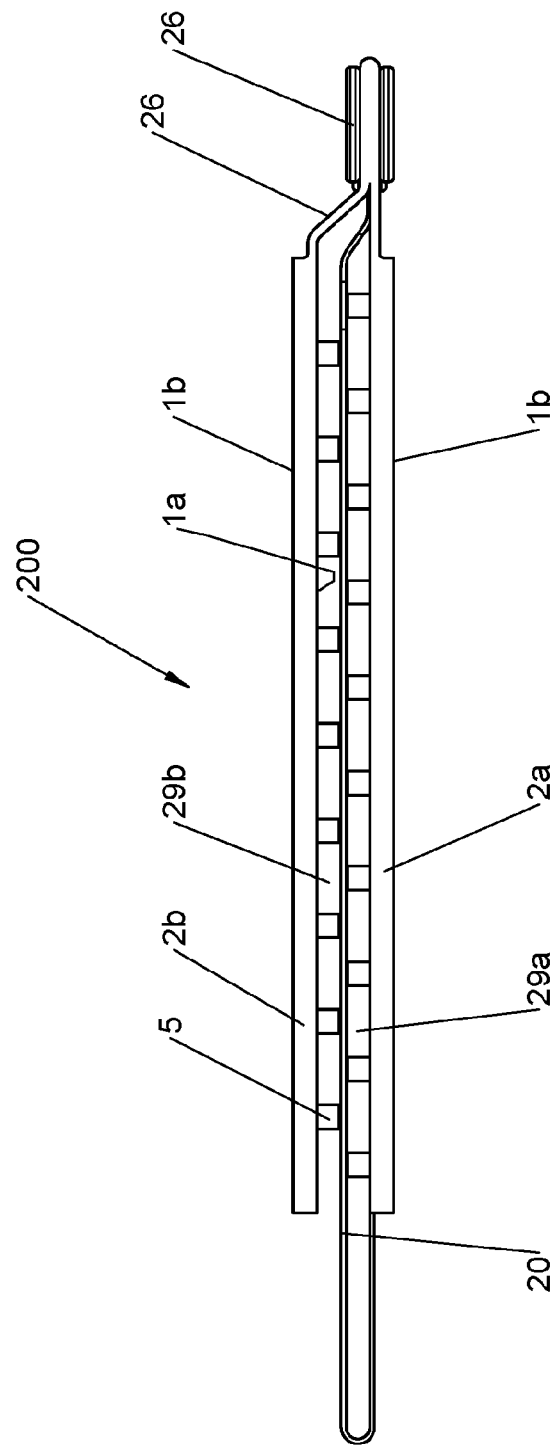
FIG. 6a provides a side view of a capacitor which can be formed using the strip of FIG. 5.
Figure 6B:
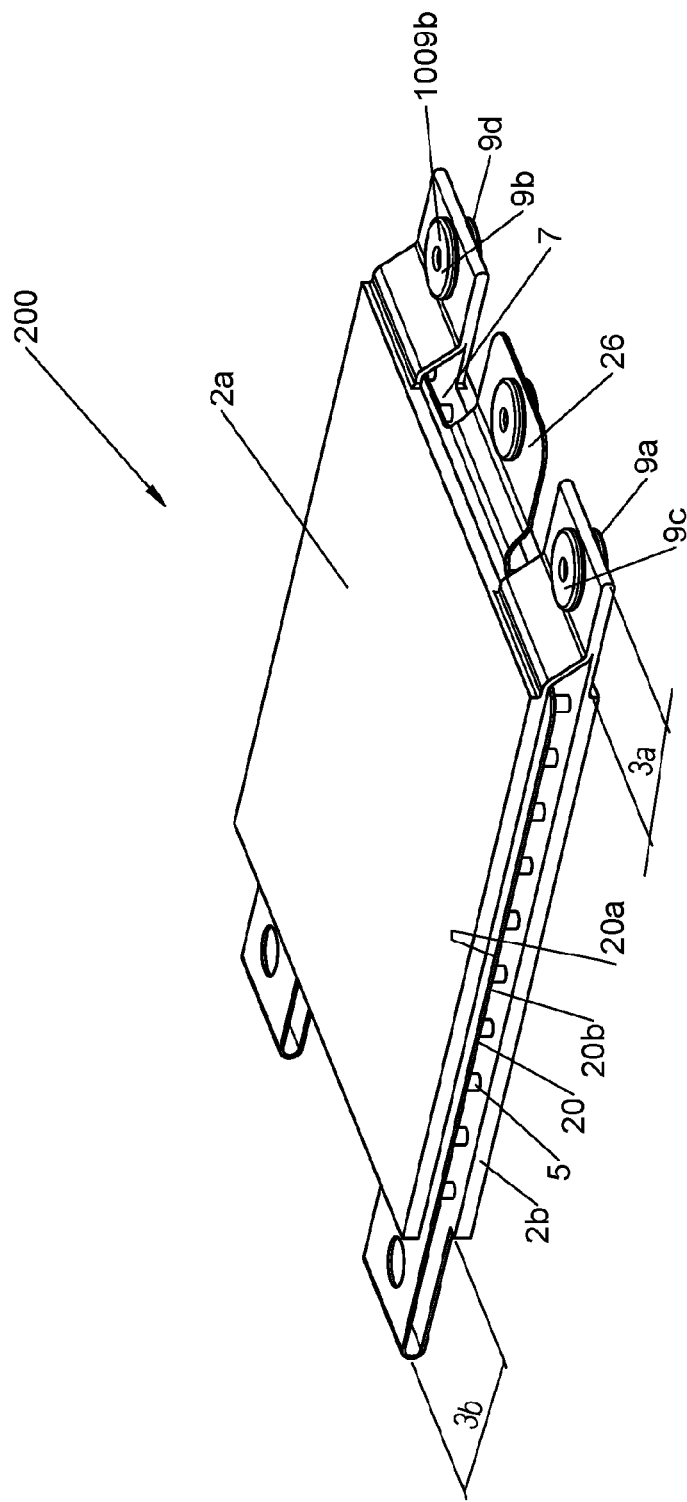
FIG. 6b provides a perspective view of a capacitor which can be formed using the strip of FIG. 5.

The strip 50 is first folded at the second flexible portion 3b, so that the foil 20 is moved to overlay the second region 2b. The strip 50 is then folded at the first flexible portion 3a so that the first region 2a is moved to overlay the second region 2b (in the same manner described with respect to the previous embodiment) and the foil 20, thereby sandwiching the foil 20 between the first and second regions 2a,2b to form a capacitor 200 as shown in FIGS. 6a and 6b. (It will be understood that similar steps will be taken if the foil is instead connected by the second flexible portion 3b to the first region 2a). Of course it will be understood that alternatively the second region 2b and the foil 20 stack could be moved to overlay the first region 2a, thereby sandwiching the foil 20 between the first and second regions 2a,2b to form a capacitor 200 as shown in FIGS. 6a and 6b (FIG. 6a provides a side view of the capacitor 200 and FIG. 6b provides a perspective view of the capacitor 200).

During the method, when folding the strip 50 at the second flexible portion 3b so that the foil 20 is moved to overlay the second region 2b, the alignment windows 59a-d may be used to ensure that the foil 20 has a predefined position with respect to the second region 2b. Thus in an embodiment the method will comprise the steps of folding the strip 50 at the second flexible portion 3b, and moving the foil 20 with respect to the second region 2a (or moving the second region 2a with respect to the foil 20) so that the alignment windows 59a,b on one side of the axis 58 are aligned with the alignment windows 59c,d located on the other side of the axis 58. When the respective alignment windows 59a-d are aligned then the foil 20 will have a predefined position with respect to the second region 2b.

In one embodiment, after the strip 50 has been folded at the second flexible region 3b so that the foil 20 is moved to overlay the second region 2b, and the alignment windows 59a-d have been aligned, the second region 2a is secured (using any suitable securing means, preferably using adhesive such as glue) to the first surface 20a of the foil 20. This securing maintains the strip 50 in its folded configuration (i.e. folded at the at the second flexible region 3b) and to maintains the foil 20 in a fixed position relative to the second region 2b. Preferably after the strip 50 has been folded at the first flexible region 3a to sandwich the foil 20 between the first and second regions 2a, 2b of the strip 50, and the alignment windows 9a,b have been aligned, the first region 2a of the strip 50 is secured (using any suitable securing means, preferably using adhesive such as glue) to the second surface 20b of the foil 20. This securing maintains the strip 50 in its folded configuration (i.e. folded at the first flexible region 3a), and maintains the first region 2a in a fixed position relative to the foil 20. Thus the foil 20 is maintained in a fixed predefined position between first and second regions 2a, 2b, and the first and second regions 2a,2b are maintained in a fixed predefined position with respect to one another. Accordingly the method may further comprise the steps of applying adhesive (such as glue) to the foil 20 and/or to the first and second regions 2a,2b.

In this embodiment the coating of electrically conducting material 15 provided on the first and second regions 2a,2b and the coating of electrically conducting material 25 provided on the foil 20 is provided as one single coating electrically conducting material which extends over the first and second regions 2a,2b, the first and second flexible regions 3a,b, and the foil 20. Accordingly in this embodiment the second flexible region 3a needs to be cut through so as to electrically isolate the coating of electrically conducting material on the foil 20 from the coating of electrically conducting material on the second region 2b (and first region 2a). Thus in this embodiment the method will further comprise the step of cutting the second flexible region 3a, after the foil 20 has been moved to overlay the second region 2b, and the alignment windows 59a-d have been aligned (or preferably after the subsequent step of folding the strip 50 at the first flexible region 3a to sandwich the foil 20 between the first and second regions 2a, 2b of the strip 50, and the alignment windows 9a,b have been aligned).

In another embodiment coating of electrically conducting material 15 provided on the first and second regions 2a,2b and the coating of electrically conducting material 25 provided on the foil 20 are electrically isolated from one another; for example the second flexible region 3a may comprise electrically insulating material which is interposed between the coating of electrically conducting material 15 provided on the second region 2a and the coating electrically conducting material 25 provided in the foil 20. In this embodiment it would not be necessary to perform a step of cutting the second flexible region 3a.

It should be noted that the capacitor 200 as shown in FIGS. 6a and 6b operates, during use, in the same manner as the capacitor 100 shown in FIGS. 4a-d.

FIG. 7 provides a perspective view of an example of another strip 60 which could be used in a further embodiment of the present invention. The strip 60 comprises many of the same features as the strip 1 shown in FIGS. 1 and 2 and like features are awarded the same reference numbers.

However the strip 60 comprises compressible nodules 61 (unlike the strip 1 of FIG. 1 which comprised rigid nodules 5). The nodules 61 are configured to be dome-shaped so as to make them compressible. However it will be understood that the nodules 61 may have any other suitable configuration which would allow them to be compressed.

In this example the positions of the nodules 61 provided in the first region 2a correspond to the positions of the nodules 61 provided in the second region 2b; in particular the positions of the nodules 61 provided in the first region 2a and the positions of the nodules 61 provided in the second region 2b are such that when the strip 60 is folded at the first flexible region 3a each of the nodules 61 in the first region 2a can be aligned with a respective nodule 61 of the second region 2a. However it will be understood that in another embodiment the nodules 61 are positioned such that they are off-set form each other when the strip 60 is folded at the first flexible region 3a.

Figure 8:
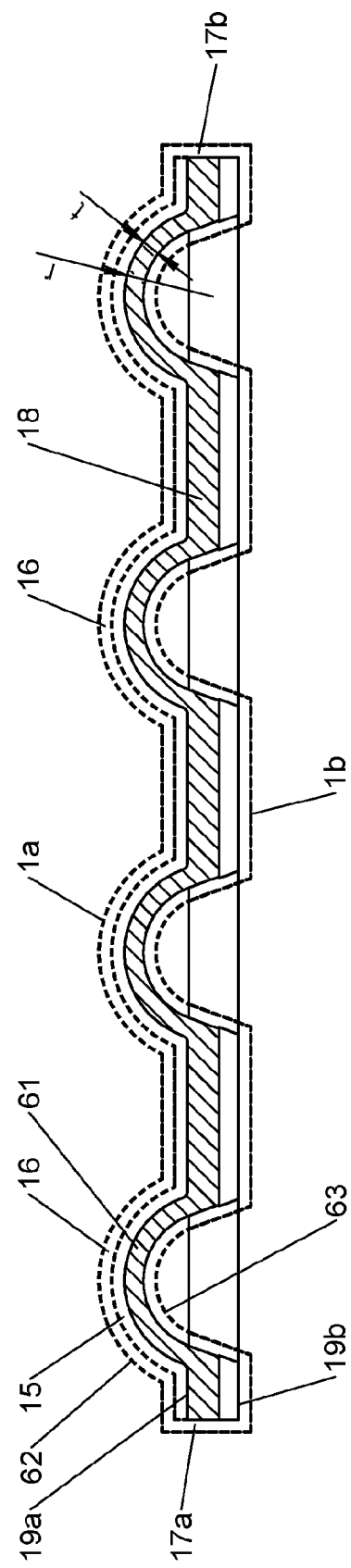
FIG. 8 provides a cross sectional view of the strip taken along line C-C' of FIG. 7.

FIG. 8 provides a cross section along C-C' of FIG. 7. The cross section of the strip 60 has many of the same features of the cross section of the strip 1 shown in FIG. 2 and like features are awarded the same reference numbers. In FIG. 8 the dome profile of the nodules 61 can be clearly seen; thus each nodule 61 comprises an outer surface 62 which is convex and an inner surface 63 which is concave. The radius (r) of curvature of the dome profile and/or thickness (t) of the silicone material between the inner surface 63 and outer surface 62, and the material hardness of the material of the core 18, defines the compressibility of the each nodule 61. To make a nodule 61 easier to compress (i.e. less force is required to compress the nodule 61) then the thickness of the silicone material between the inner surface 63 and outer surface 62 could be reduced; and/or the radius of curvature (r) of the dome profile could be increased; and/or the material of the core 18 to be changed to a material which has increased hardness.

The compressibility of each nodule 61 in turn defines the sensitivity of the capacitor to applied forces; the easier it is to compress each nodule 61 the more sensitive the capacitor will be to applied forces.

Referring back to FIG. 7, the strip 60 further comprises a plurality of air channels 69 which are defined in the first surface 1a of the strip 60. Each air channel 69 is in fluid communication with the volume defined by the inner surface 63 of the dome-shaped nodule 61. In this example each air channel 69 is in fluid communication with the respective volumes defined by the inner surfaces 63 of four nodules 61, so that in this example each air channel 69 serves four nodules 61. When a dome-shaped nodule 61 is compressed air which was within the volume defined by the inner surface 63 of that nodule 61 is expelled along an air channel 69.

FIG. 7 also shows that the strip 60 further comprises an electrical contact 64. The electrical contact 64 is electrically connected to the coating of electrically conductive material 15 which is provided on the first surface 19a of the silicon core 18. The electrical contact 64 be electrically connected to a PCB and/or to an electrical cable.

Figure 9A:
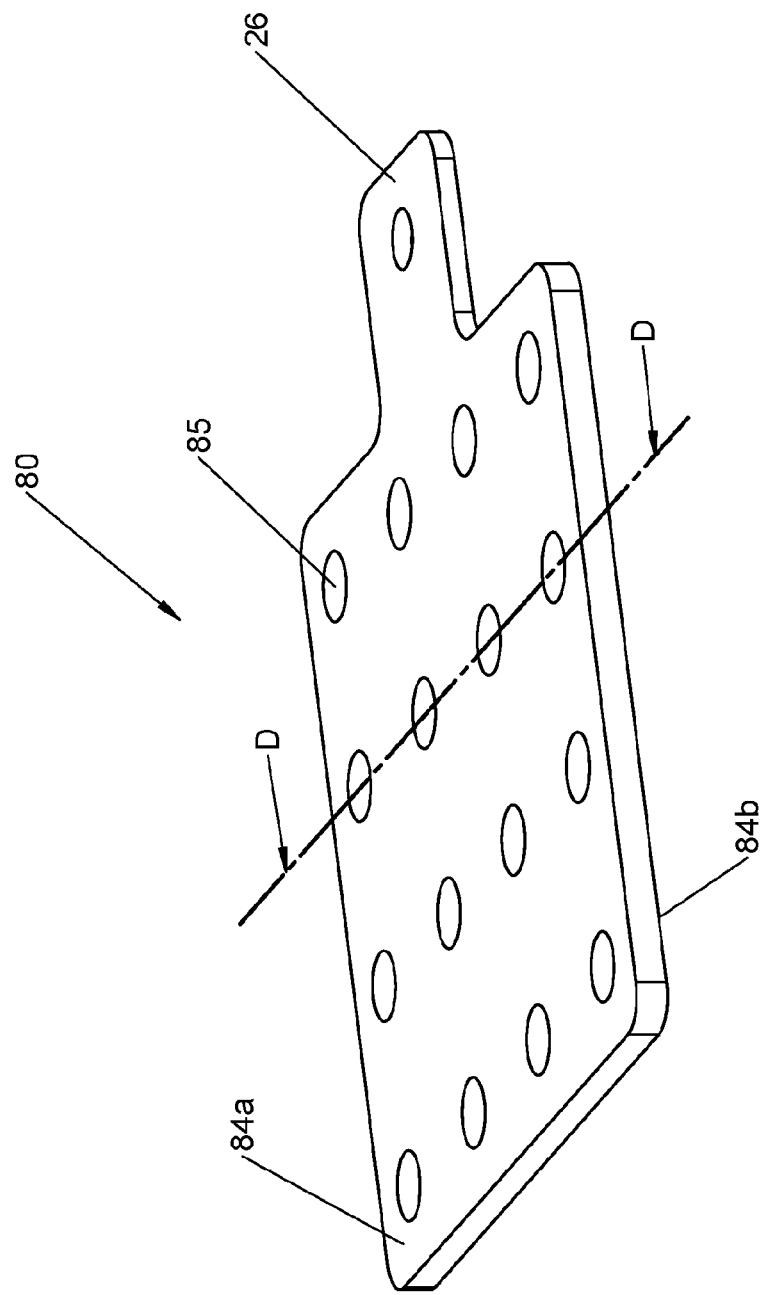
FIG. 9a provides a perspective view of a foil which can be used in another embodiment of the present invention.
Figure 9B:
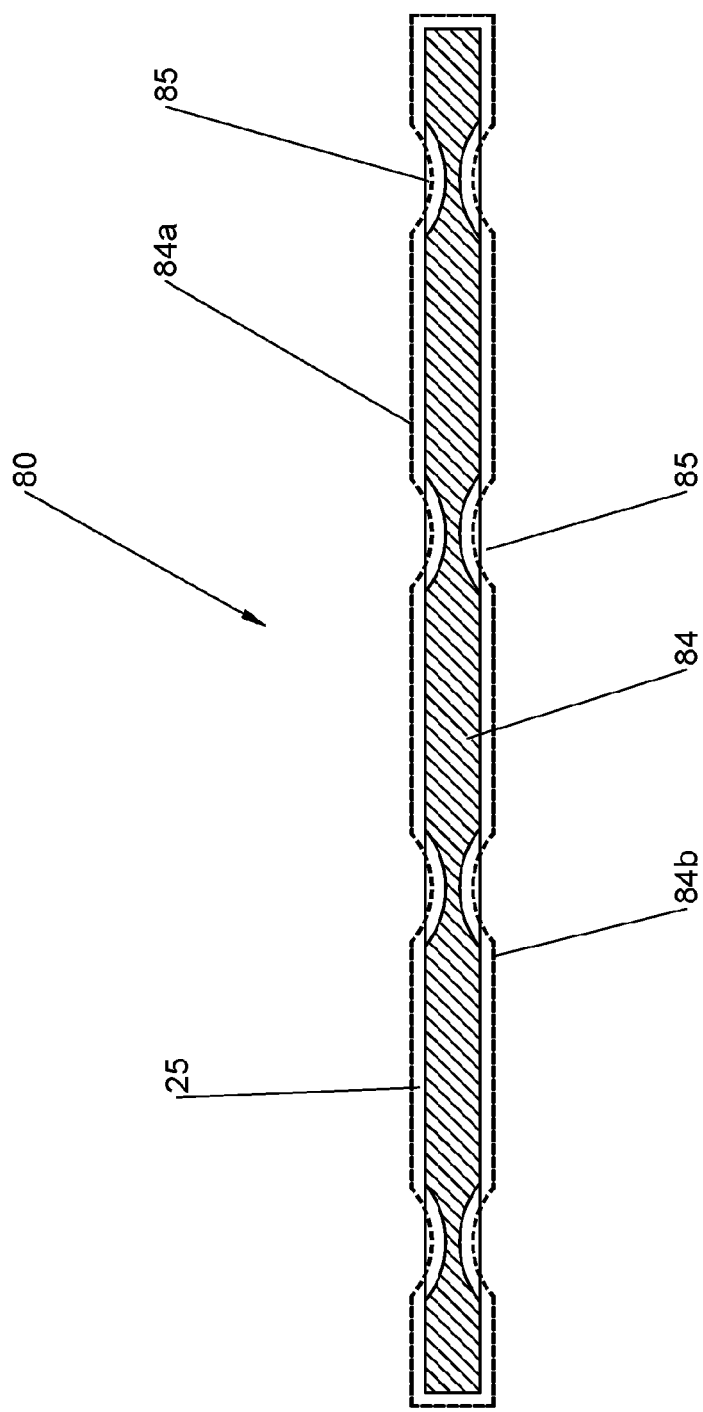

FIG. 9a provides a perspective view of a foil 80 which could be used in and embodiment of the present invention; in particular the foil 80 is suitable for use in combination the strip 60 shown in FIGS. 7 and 8 to form a capacitor. FIG. 9b provides a cross sectional view taken along D-D' of FIG. 9a. The foil 80 has some features in common with the foil 20 shown in FIGS. 3a,3b and like features are awarded the same reference numbers.

Importantly the foil 80 has a first surface 84a and a second surface 84b which is opposite to the first surface 84a. Each of the first and second surfaces 84a,b have a plurality of depressions 85 defined therein.

As can be seen in FIG. 9b, each depression 85 defined in the first surface 84a is aligned with a respective depressions 85 defined in the second surface 84b. The positions of the depressions 85 on the first and second surfaces 84a,b correspond to the positions of the nodules 61 on the first and second regions 2a,2b when the strip 60 has been folded at its first flexible portion 3a. In this embodiment the positions of the depressions 85 defined in the second surface 84b correspond to the positions of the nodules 61 on the first region 2a of the strip 60 when the strip 60 has been folded at the first flexible portion 3a, and the positions of the depressions 85 defined in the first surface 84a correspond to the positions of the nodules 61 on the second region 2b of the strip 60 when the strip 60 has been folded at the first flexible portion 3a. Each depression 85 is dimensioned so that it can receive at least a portion of a corresponding nodule 61 on the first or second region 2a,2b of the strip 60.

In another embodiment, in which the nodules 61 are positioned such that they are off-set form each other when the strip 60 is folded at the first flexible region 3a the depressions 85 defined in the first surface 84a are off-set from the depressions 85 defined in the second surface 84b. The off-set between the depressions 85 on the first and second surfaces 84a,b correspond to the off-set which exists between the nodules 61 on the first region 2a and the nodules 61 on the second region 2b when the strip 60 has been folded at its first flexible portion 3a. Preferably the positions of the depressions 85 defined in the second surface 84b correspond to the positions of the nodules 61 on the first region 2a of the strip 60 when the strip 60 has been folded at the first flexible portion 3a, and the positions of the depressions 85 defined in the first surface 84a correspond to the positions of the nodules 61 on the second region 2b of the strip 60 when the strip 60 has been folded at the first flexible portion 3a.

As was the case for the foil 20, the foil 80 comprises a core 84 composed of Silicone. Unlike the core 24 shown in FIG. 3b, the core 84 is profiled so as to define the depressions. It will be understood that the core 84 of the foil 84 may be composed of any suitable material; preferable the core 84 comprises a flexible and/or elastic material. For example said core 84 may comprise one or more of, Silicone, elastomeric material, natural and synthetic rubber materials (NBR, HNBR, CR, EPDM), Polyurethane, and/or Polyacrylate; any suitable rigid conductive materials such as metallic, semiconductive materials or thermoplastic composite materials comprising conductive particles and/or fibers; the core 84 may comprise elastic fibers and/or elastic cloth. The silicone core 84 also has a coating of electrically conductive material 25.

In this embodiment the foil 80 is configured to have a Young's modulus of 30 N/mm$^2$. Thus the foil 80 has a low elasticity and is thus reasonably rigid. However it should be understood that the foil 80 could be configured to have a Young's modulus of any value; preferably the foil 80 could be configured to have a Young's modulus in the range 1-100 N/mm$^2$, and preferably in the range 0.3-30 N/mm$^2$.

In a method for manufacturing a capacitor according to an embodiment of the present invention, there is provided a strip 60 as shown in FIGS. 7 and 8, and a foil 80 as show in FIGS. 9a and 9b.

The foil 80 is positioned to overlay the first region 2a of the strip 60 and the strip 60 is then folded at the first flexible portion 3a, so as to move the second region 2b of the strip 80 to overlay the first region 2a, thereby sandwiching the foil 80 between the first and second regions 2a,2b. It will be understood that in a variation of this embodiment the foil 80 is positioned to overlay the first region 2a of the strip 60 and the strip 60 is then folded at the first flexible portion 3a, so as to move the first region 2a of the strip 80 and the foil 80 to overlay the second region 2b, thereby sandwiching the foil 80 between the first and second regions 2a,2b

Importantly in this embodiment the foil 80 is moved and/or the first and second regions 2a,2b of the strip 60 are moved, so that each of the nodules 61 on the first and second regions 2a,2b of the strip 60 are received into a respective depression 85 in the foil 80. In this example the foil 80 is moved and/or the first and second regions 2a,2b of the strip 60 are moved so that, the top portion of each of the nodules 61 on the first region 2a of the strip 60 is received into a corresponding depression 85 defined in the second surface 84b of the foil 80, and the top portion of each of the nodules 61 on the second region 2b of the strip 60 is received into a corresponding depression 85 defined in the first surface 84a of the foil 80.

When the foil 80 and/or the first and second regions 2a,2b of the strip 60 have been moved so that each of the nodules 61 on the first and second regions 2a,2b of the strip 60 are received into a respective depression 85 in the foil 80, then the foil 80, and the first and second regions 2a,2b of the strip 60 will be arranged in a predefined, desired, position relative to one another. Thus, in this embodiment alignment of the foil 80, and the first and second regions 2a,2b, is facilitated by the depressions 85 in the foil 80; hence in this embodiment advantageously alignment windows in the strip are not required to achieve alignment.

In one embodiment the first and second regions 2a,2b are securing (using any suitable securing means, preferably using adhesive such as glue) to the respective second and first surfaces 84a,b of the foil 80 so that the foil 80, and the first and second regions 2a,2b of the strip 60 are maintained fixed in said predefined, desired, position relative to one another. Preferably nodules 61 on the first and second regions 2a,2b of the strip 60 are secured (using any suitable securing means, preferably using adhesive such as glue) to the surfaces which define the respective depression 85 in the foil 80 in which they are received. Thus the method may comprise the steps of applying adhesive (such as glue) into the depressions 85 and/or onto the outer surfaces 62 of the nodules 61.

Figure 10:
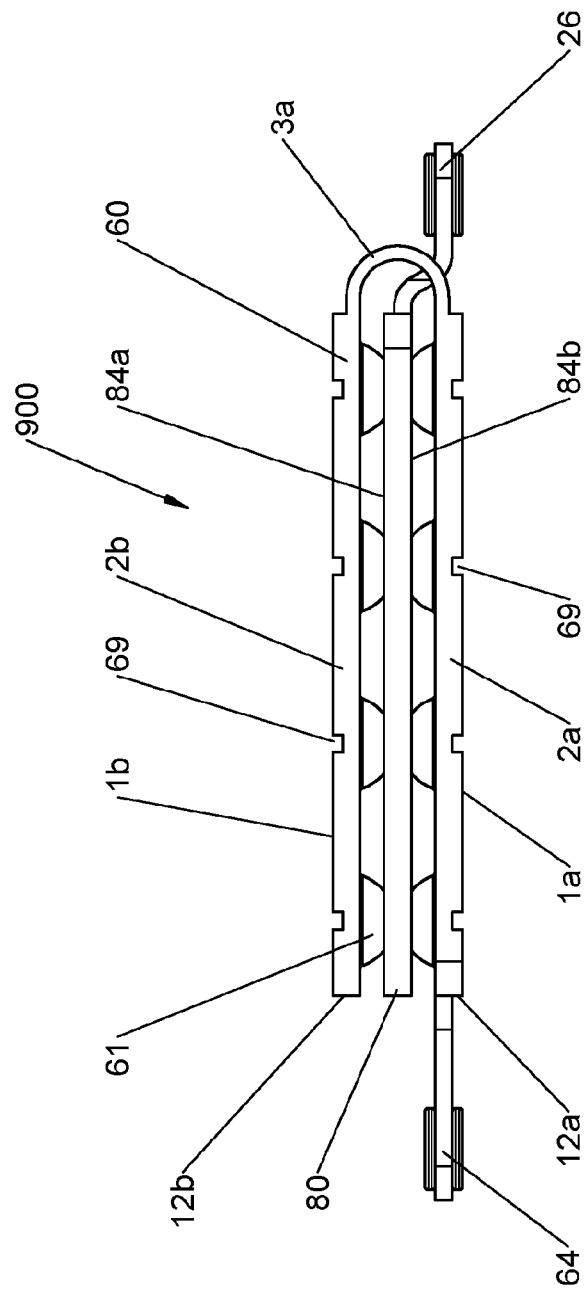
FIG. 10 provides a side view of a capacitor formed using the strip of FIGS. 7 and 8 and the foil of FIGS. 9a and 9b.

FIG. 10 provides a side view of a capacitor 900 according to an embodiment of the present invention, which results when the above-mentioned method steps have been performed. As shown in FIG. 10 the strip 60 is folded at the first flexible portion 3a; the second region 2b of the strip 60 overlays the first region 2a, and the foil 80 is sandwiched between the first and second regions 2a,2b. The foil 80 and/or the first and second regions 2a,2b of the strip 60 have been moved into a position whereby each of the nodules 61 in the first and second regions 2a,2b of the strip 60 is received into a corresponding depression 85 in the foil 80. In this position the perimeters 12a, 12b of the respective first and second regions 2a,2b are also in alignment. It should be understood that in this embodiment only a portion of each nodule 61 is received into a corresponding depression 85 in the foil 80. Preferably nodules 61 on the first and second regions 2a,2b of the strip 60 are secured (using any suitable securing means, preferably using adhesive such as glue) to surfaces which define the respective depressions 85 in the foil 80 in which they are received.

FIG. 10 also illustrates that the nodules 61 of the first region 2a are aligned with the nodules 61 of the second region 2b (in contrast to the embodiment shown in FIG. 4a-d).

In this example the foil 80 is reasonably rigid (having a Young's modulus of 30 N/mm$^2$) and the nodules 61 are compressible (this is in contrast to the capacitor shown in FIGS. 4a-d which had more rigid nodules 5 and a more elastic/flexible foil 20). In the capacitor 900 shown in FIG. 10 the dome-shaped profile of the nodules 61 allows for the second region 2b to be moved towards the first region 2a (i.e. the nodules 61 can be compressed to allow the second region 2b to be moved towards the first region 2a (or vice versa)). The thickness (t) of the silicone material between the inner surface 63 and outer surface 62 of each nodule 61 defines the force required to compresses the nodule 61, which in turn defines the force require to moved the second region 2b towards the first region 2a (or vice versa), and which in turn defines the sensitivity (i.e. a lower sensitivity means that a lower force is required to be applied to the move the first and second regions closer to one another and thus cause a change in capacitance of the capacitor 900; a higher sensitivity means that a larger force needs to be applied to the move the first and second regions closer to one another and thus cause a change in capacitance of the capacitor 900). The sensitivity the capacitor 900 can also depend on the thickness of coatings of electrically conductive material 15 and the thickness of the coating of insulating material 16; conductive surface area of the first and second regions 2a,2b, material hardness of the core 18,84, the amount of nodules 61, and distance between nodules, and/or the height of the nodules 61).

Referring again to FIG. 10, during use of the capacitor 900, one may apply a force (e.g. a push force) to an exposed surface 1b of the strip 60; so long as the force is sufficient to compress a nodule 61 the second region 2b will be moved in a direction towards the first region 2a (or vice versa).

The electrically conductive coating 15 of the strip 60 defines a first electrode of a capacitor, and the electrically conductive coating 25 on the foil 80 defines a second electrode of a capacitor. As the second region 2b moves towards the first region 2a the nodules 61 will compress against the rigid foil 80 thus moving the electrically conductive coating 15 of the strip 60 closer to electrically conductive coating 25 on the foil 80; this in turn increases the capacitance of the capacitor 900 as the components which define the electrodes of a capacitor are moved closer to one another. By measuring the capacitance, the force applied to the exposed surface 1b of the strip 60, can be determined.

A change in capacitance may be detected using techniques known in the art. For example, since capacitors resist a change in voltage, the capacitance can be indirectly measured through an applied voltage. By applying a voltage to the capacitor 100 and comparing the actual voltage output to what would be expected without a capacitor 100, the capacitance of the capacitor 100 can be determined.

The sensitivity of the capacitor sensor 900 could be increased by reducing the thickness (t) of the material between the inner 63 and outer 62 surfaces of the dome-shaped nodules 61; and/or by increasing the radius of curvature (r) of the dome-shaped nodules 61; by increasing the rigidity of the foil 80; by reducing the thickness of the electrically conductive and non-conductive material; by decreasing the number of nodules 61 provided in the first and second regions 2a,2b; by increasing the height of the nodules 61; by decreasing the depth of the depressions 82 in the foil 80; and/or by forming the nodules 61 from material which has a lower Young's modulus. It will be understood that the sensitivity of the capacitor sensor 900 could be decreased by increasing the thickness (t) of the material between the inner 63 and outer 62 surfaces of the dome-shaped nodules 61; and/or by decreasing the radius of curvature (r) of the dome-shaped nodules 61; by decreasing the rigidity of the foil 80; by increasing the thickness of the electrically conductive and non-conductive material; by increasing the number of nodules 61 provided in the first and second regions 2a,2b; by decreasing the height of the nodules 61; by increasing the depth of the depressions 82 in the foil 80; and/or by forming the nodules 61 from material which has higher Youngs modulus.

Figure 11:
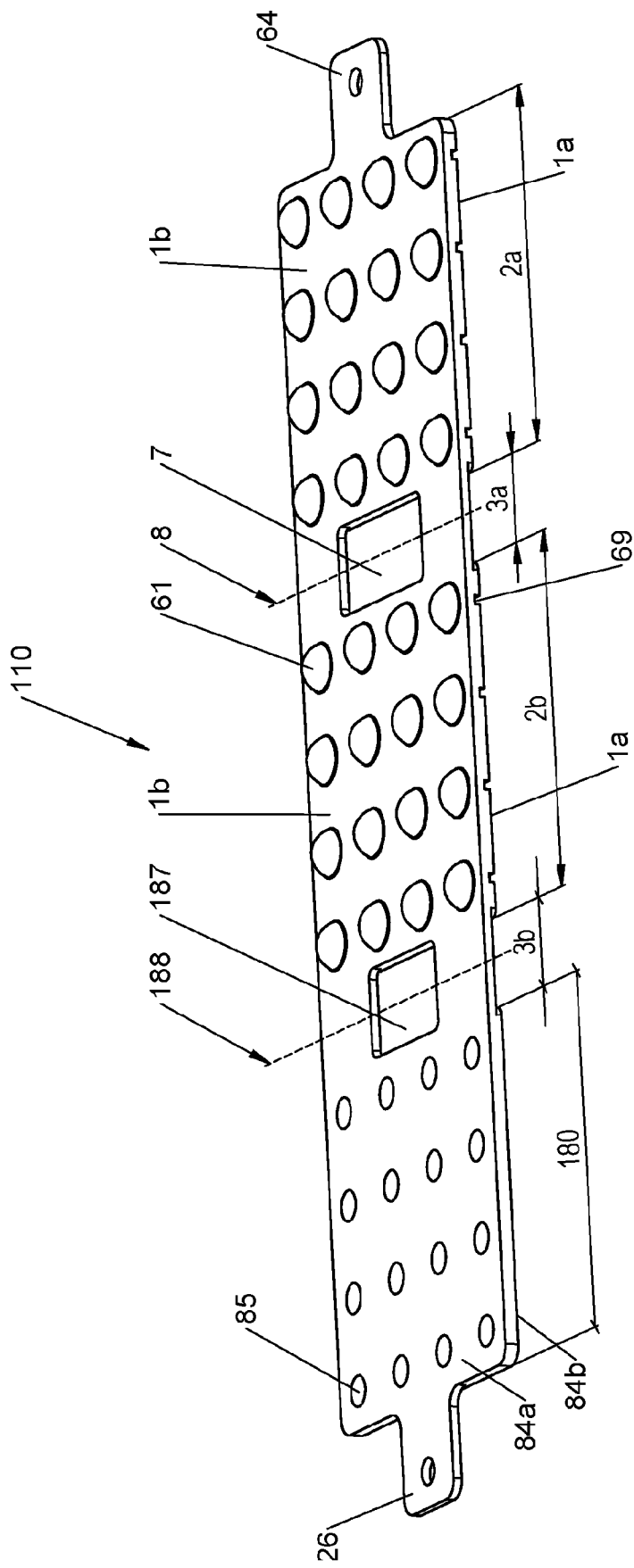
FIG. 11 provides a perspective view of a strip which can be used in another embodiment of the present invention.

FIG. 11 provides a perspective view of a strip 110 which could be used in another embodiment of the present invention. The strip 110 comprises many of the same features of the strip 60 shown in FIG. 7 and like features are awarded the same reference numbers. However in this embodiment a foil 180 is integral to the strip 110. Specifically the strip 110 further comprises a second flexible portion 3b which connects the foil 180 to the second region 2b. It should be understood that the second flexible portion 3b could alternatively be arranged to connect the foil 80 to the first region 2a. The foil 180 has all of same features of the foil 80 shown in FIGS. 9a,9b and like features are awarded the same reference numbers.

In this example the second flexible portion 3b is designed such as to allow the strip 110 to be folded at this section so that the foil 180 can be moved to overlay the second region 2b. (It will be understood that if the second flexible portion 3b connects the foil 180 to the first region 2a, then it will be designed such as to allow the strip 110 to be folded at this section so that the foil 180 can be moved to overlay the first region 2a).

The second flexible portion 3b has many of the same features as the second flexible portion 3b of the previous embodiments; however it is noted that preferably no alignment windows are provided in either of the first or second flexible portions 3a,3b, this is because alignment of the foil 180, and the first and second regions 2a,2b is achieved using the depressions 85 provided in the first and second surfaces 84a,84b of the foil 180.

Preferably an axis 188, which is parallel to the plane of the strip 110, and which extends across the second flexible portion 3b, defines a fold line 188 along which the strip 110 is to be folded. Typically, but not always, the axis 188 will be position to bisect the length of the second flexible portion 3b. The thickness (in a direction perpendicular to the plane of the strip 110) of second flexible portion 3b is less than the thickness (in a direction perpendicular to the plane of the strip 110) of the regions of first and second regions 2a,2b which are without nodules 61, thus making it easier to fold the strip 110 at the second flexible portion 3b. Preferably the strip 110 is formed of a single moulded piece. In this embodiment the second flexible portion 3b further comprises a cut-out 187 which reduces the amount of material in the second flexible portion 3b, which further increases the flexibility of this portion. However it will be understood that the cut-out 187 is an optional feature.

In another embodiment the material composition of the first and second regions 2a,2b, and material composition of the foil 180, is different to the material composition of the second flexible portion 3b; in such an embodiment the regions of the first and second regions 2a,2b which are without nodules 61, and the second flexible portion 3b, may all have equal thickness (in a direction perpendicular to the plane of the strip 110), but the second flexible portion 3b may be composed of material which is more flexible than the material of the first and second regions 2a,2b, and material of the foil 180, thus making it easier to fold the strip 110 at the second flexible portion 3b.

In a further embodiment of a method for manufacturing a capacitor according to the present invention, there is provided a strip 110 as shown in FIG. 11.

The strip 110 is first folded at the second flexible portion 3b, so that the foil 180 is moved to overlay the second region 2b. Preferably then the foil 180 is moved so that the nodules 61 on the second region 2b are received into respective depressions 85 defined in the first surface 84a of the foil 180. Preferably the foil 180 is secured (using any suitable securing means, preferably using adhesive such as glue) to the second region 2b; most preferably the nodules 61 on the second region 2b are secured (using any suitable securing means, preferably using adhesive such as glue) to the surfaces defining the depressions 85 (on the first surface 84a of the foil 180) in which they are received.

The strip 180 is then folded at the first flexible portion 3a so that the first region 2a is moved to overlay the second region 2b (in the same manner described with respect to the previous embodiments) and the foil 180, thereby sandwiching the foil 20 between the first and second regions 2a,2b.

Figure 12:
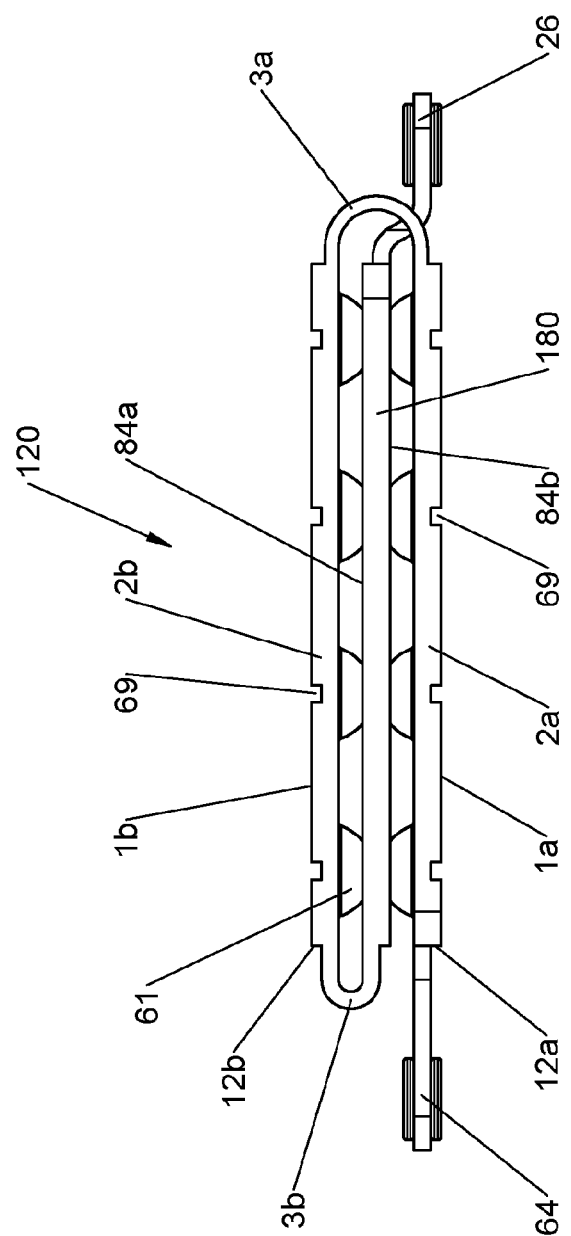
FIG. 12 provides a side view of a capacitor formed using the strip of FIG. 11.

Importantly the foil 180 and/or the first region 2a is moved so that the nodules 61 on the first region 2a are received into respective depressions 85 defined in the second surface 84b of the foil 180, to form a capacitor 120 as shown in FIG. 12. Preferably the foil 180 is secured (using any suitable securing means, preferably using adhesive such as glue) to the first region 2a; most preferably the nodules 61 on the first region 2a are secured (using any suitable securing means, preferably using adhesive such as glue) to the surfaces defining the depressions 85 (on the second surface 84b of the foil 180) in which they are received.

In this embodiment the coating of electrically conducting material 15 provided on the first and second regions 2a,2b and the coating of electrically conducting material 25 provided on the foil 180 is provided as one single coating electrically conducting material which extends over the first and second regions 2a,2b, the first and second flexible regions 3a,b, and the foil 180. Accordingly in this embodiment the second flexible region 3a needs to be cut through so as to electrically isolate the coating of electrically conducting material on the foil 180 from the coating of electrically conducting material on the second region 2b (and first region 2a). Thus in this embodiment the method will further comprise the step of cutting the second flexible region 3a, after the foil 180 has been moved to overlay the second region 2b, and the nodules 61 on the second region 2b have been received into respective depressions 85 on the first surface 84a of the foil 180; (or preferably after the subsequent step of folding the strip 110 at the first flexible region 3a to sandwich the foil 180 between the first and second regions 2a, 2b of the strip 110, and the nodules 61 on the first region 2a have been received into respective depressions 85 on the second surface 84b of the foil 180).

In another embodiment coating of electrically conducting material 15 provided on the first and second regions 2a,2b and the coating of electrically conducting material 25 provided on the foil 20 are electrically isolated from one another; for example the second flexible region 3a may comprise electrically insulating material which is interposed between the coating of electrically conducting material 15 provided on the second region 2a and the coating electrically conducting material 25 provided in the foil 20. In this embodiment it would not be necessary to perform a step of cutting the second flexible region 3a.

In a variation of this embodiment, instead of moving the first region 2a to overlay the second region 2b and the foil 180, the second region 2b and foil 180 stack may be moved to overlay the first region 2b; in this case the second region 2b and foil 180 stack is moved so that the nodules 61 on the first region 2a are received into respective depressions 85 defined in the second surface 84b of the foil 180, to form a capacitor 120.

It will be understood that similar steps to those described above will be taken if the foil 180 is instead connected by the second flexible portion 3b to the first region 2a.

It should be noted that the capacitor 120 as shown in FIG. 12 operates, during use, in the same manner as the capacitor 900 shown in FIG. 10.

Figure 13A:
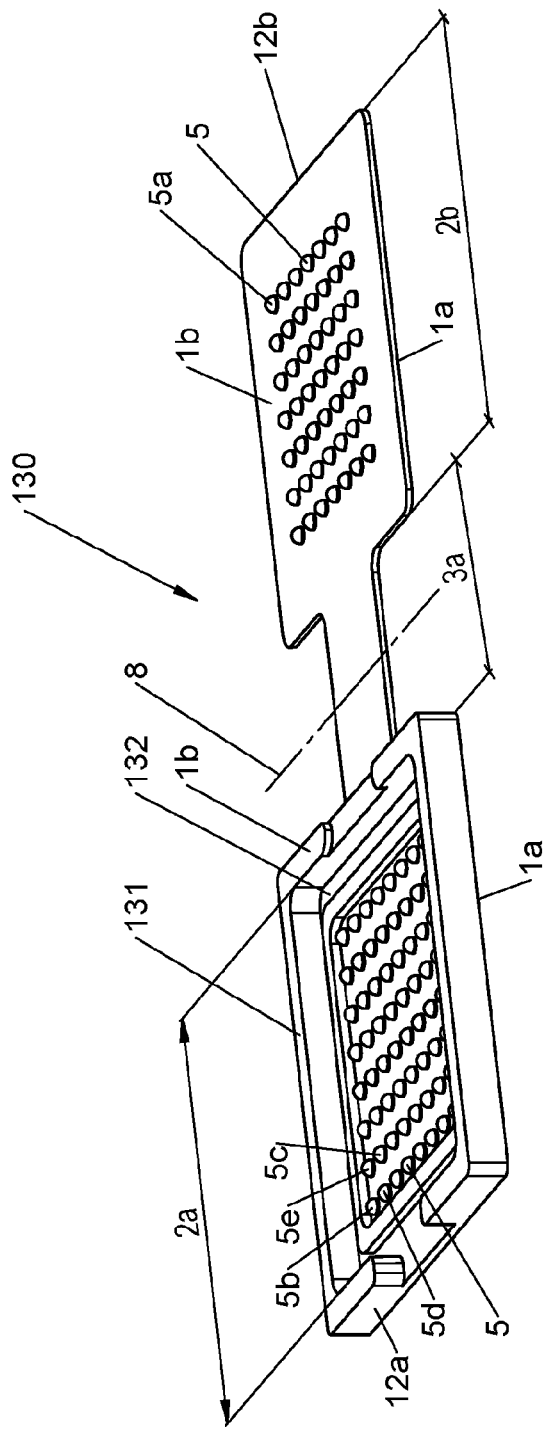
FIG. 13a provides a perspective view of a strip which can be used in another embodiment of the present invention.

FIG. 13a provides a perspective view of a strip 130 which could be used in another embodiment of the present invention. The strip 130 may comprise any of the features of the strips 1,60 shown in FIGS. 1 and 7 and like features are awarded the same reference numbers.

The strip 130 further comprises a frame 131 which is arranged to surround the first region 2a of the strip 130. The frame defines a pocket 132.

Figure 13B:
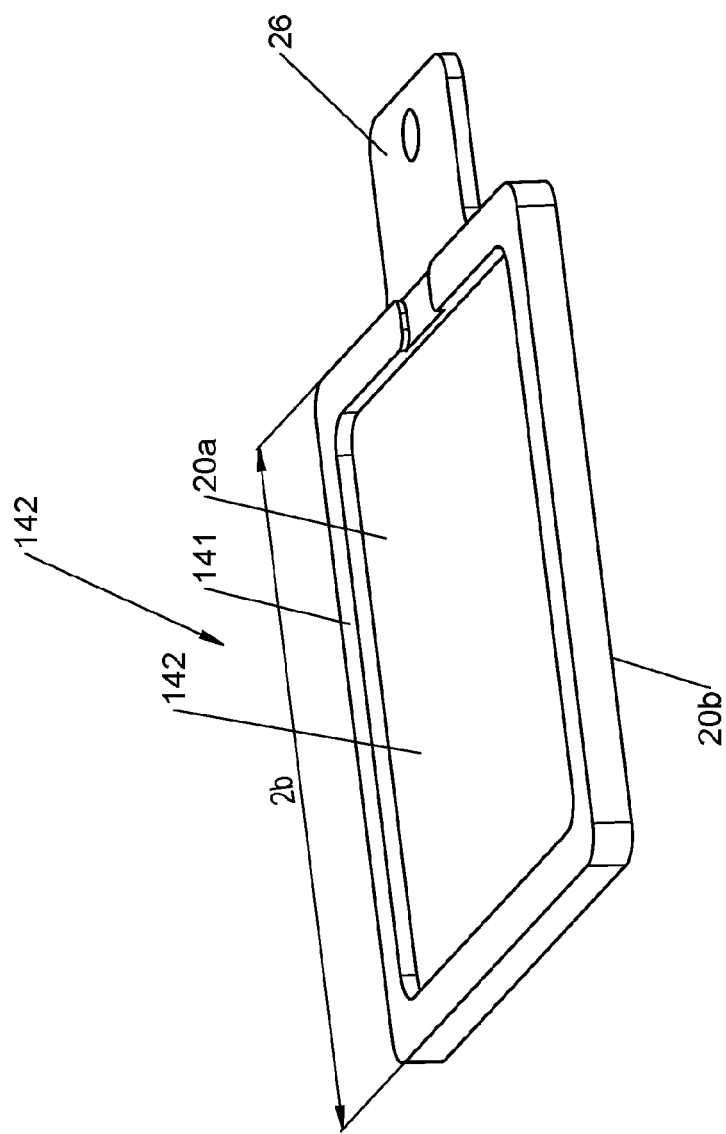
FIG. 13b provides a perspective view of a foil which can be used in another embodiment of the present invention.

FIG. 13b provides a perspective view of a foil 140 which could be used in another embodiment of the present invention. The foil 140 may comprise any of the features of the foils 20, 80,60 shown in FIGS. 3a,b and 9a,b and like features are awarded the same reference numbers.

The foil 140 further comprises a reinforcement member 141. The reinforcement member defines a first pocket 142 which can receive a second region 2b (or first region 2a) of a strip 130. The silicone core 24,84 of the foil 140, with its coating of electrically conductive material 25, is held within the reinforcement member 141. The reinforcement member 141 may further comprise adhesive material which can hold the second region 2b (or first region 2a) of the single silicone strip in the first pocket 142.

Referring back to FIG. 13a the pocket 132 defined by the frame 131 is preferably dimensioned so that it can receive the foil 140 shown in FIG. 13b so that preferably the foil 140 can be fully contained within the pocket 132 (i.e. the pocket 132 defined by the frame 131 is preferably dimensioned so that it can receive the reinforcement member 141, so that preferably the reinforcement member 141 can be fully contained within the pocket 132).

In a method for manufacturing a capacitor according to a further embodiment of the present invention, there is provided a strip 130 as shown in FIG. 13a and a foil 140 as show in FIG. 13b.

The strip 130 is folded at the first flexible portion 3a; and the second region 2b of the strip 130 is moved into the pocket 142 of the foil 140. Preferably the second region 2b will be fully contained within the pocket 142. Preferably adhesive means (e.g. glue) is then used to secure the second region 2b to the reinforcement member 141 of the foil 140 so that the second region 2b of the strip 140 is maintained in the pocket 142.

The foil 140 (which also contains the second region 2b secured within its reinforcement member 141) is then moved into the pocket 132 of the frame 131 of the strip 130, to form a capacitor according to a further embodiment. This step may require further folding of the strip 130 at the first flexible portion 3a. Optionally adhesive means (e.g. glue) is used to secure the foil 140 to the frame 131 of the strip 130 so that the foil 140 is maintained in the pocket 132 of the frame 131 of the strip 130.

Advantageously the pocket 142 of the foil 140 ensures that the second region 2b is maintained in a fixed position with respect to the foil 140; and the pocket 132 ensures that the foil 140 is maintained in a fixed position with respect to the first region 2a of the strip 130, thus also ensuring that the second region 2b is maintained in a fixed position with respect to the first region 2a.

Figure 14:
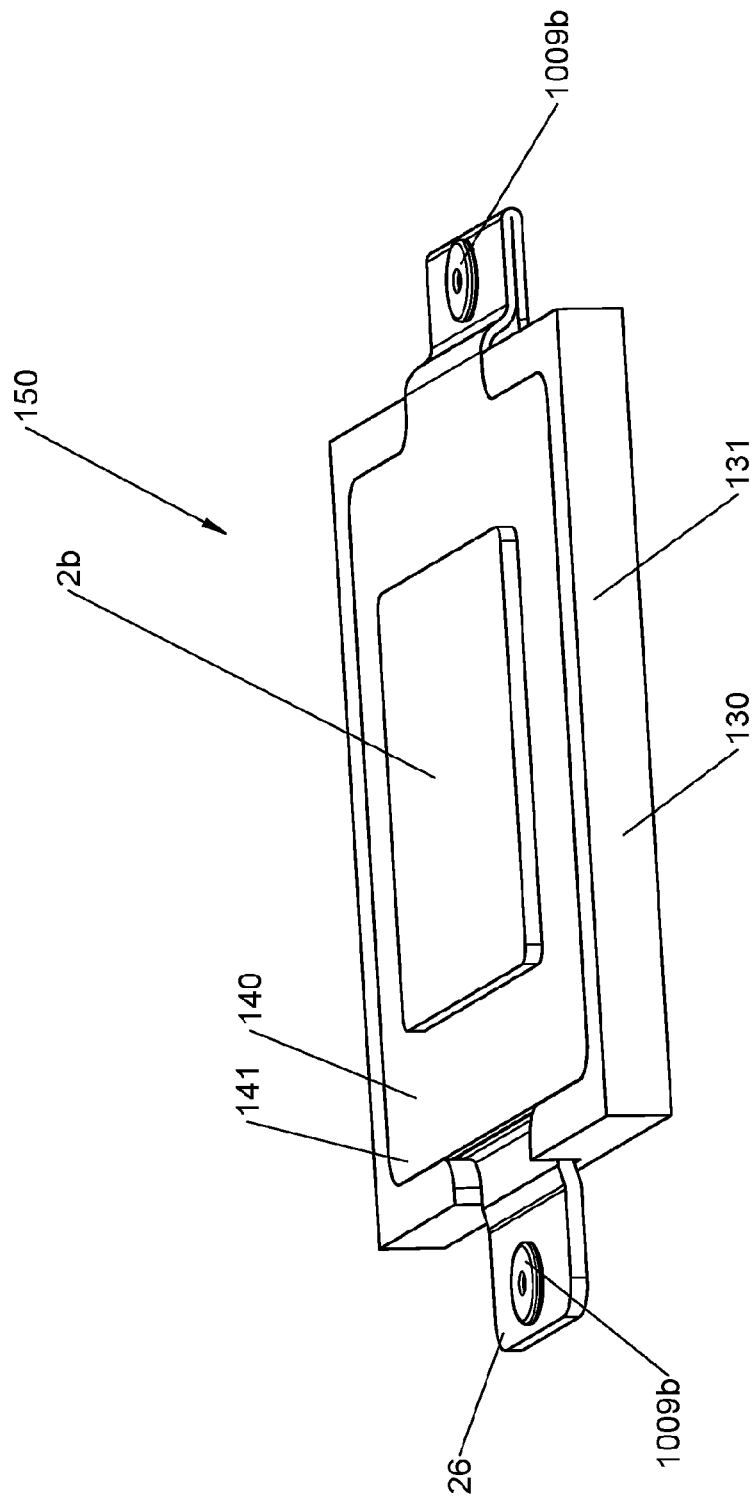
FIG. 14 provides a perspective view of a capacitor formed using the strip of FIG. 13a and the foil of FIG. 13b.

FIG. 14 provides a perspective view of a capacitor 150 according to a further embodiment of the present invention, which is formed when the above-mentioned steps are performed.

It will be understood that during use the capacitor 150 will operate in a similar manner to the previous embodiments.

Figure 16:
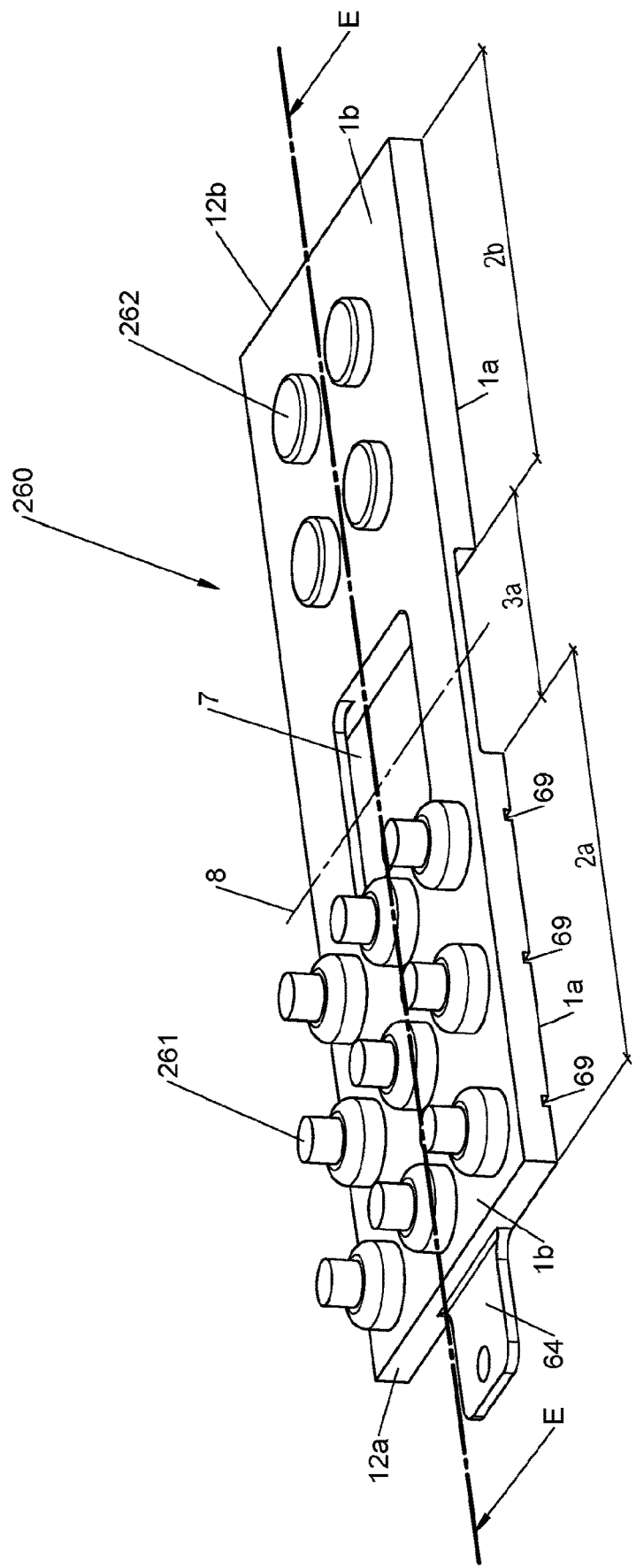
FIG. 16 provides a perspective view of a strip which can be used in another embodiment of the present invention.

FIG. 16 provides a perspective view of an example of another strip 260 which could be used in a further embodiment of the present invention. The strip 260 comprises many of the same features as the strips 1 and 60 shown in FIGS. 1,2 and 7,8 and like features are awarded the same reference numbers.

However the strip 260 comprises different nodules; the strip 260 comprises a first type of nodule 261 provided in the first region 2a of the strip and a second, different type of nodule 262 provided in the second region 2b. The nodules 261 provided in the first region 2a are configured to be compressible, while the nodules 262 provided in the second region 2b are configured to be more rigid than those provided in the first region 2a; preferably the nodules 262 provided in the second region 2b are configured to be substantially incompressible.

Figure 17:
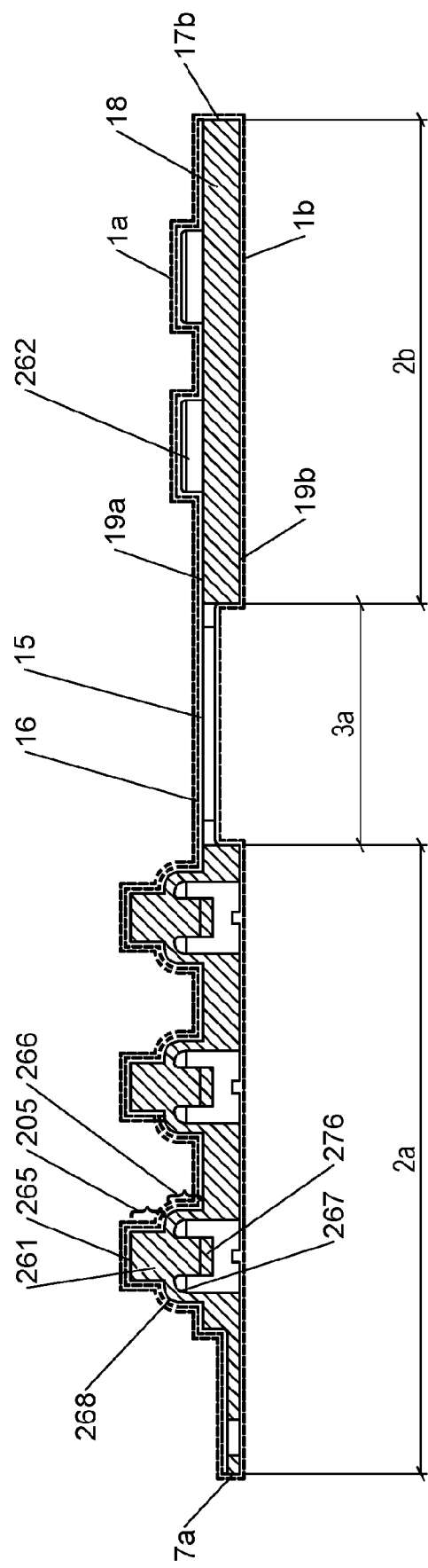
FIG. 17 provides a cross sectional view of the strip taken along lines E-E' of FIG. 16; which can be used in another embodiment of the present invention.

FIG. 17 provides a cross sectional view along line E-E' of FIG. 16, and provides a more detailed illustration of the nodules 261 and 262 provided in the first and second regions 2a, 2b respectively. The nodules 262 in the second region 2b are simple cylindrical projections.

Each of the nodules 261 in the first region 2a comprise a crown portion 265 (referred to in the art as a "key top" 265) and a skirt portion 266. The skirt portion 266 is a membrane. The skirt portion 266 is defined by a dome-shaped portion of silicone, so the skirt portion 266 comprises an inner surface 267 and an outer surface 268. The thickness of the material between the inner surface 267 and outer surface 268 of the skirt portion 266 is less than the thickness of the material in the other parts of the nodule 261; the reduced thickness of the material at the skirt portion 266 allows for the nodule 261 to collapse inwards at the skirt portion when a force is applied to the nodule 261. Thus, it is the skirt portion 266 which makes the nodule 261 compressible: when a force is applied to the key top 265 of a nodule 261 the skirt portion 266 collapses inwardly thereby allowing the nodule 261 to be compressed. An electrical contact 276 (commonly referred to as a "pill") is further provided on an inner surface 267 of the skirt portion 266. Typically the strip 260 will be positioned so that the pill 276 of each nodule 261 is aligned over an electrical contact provided on the PCB board so that when a force is applied which causes the skirt portion 266 to collapse inwardly, the inward collapsing of the skirt portion 266 moves the pill 276 so that it establishes electrical connection with the electrical contact on the PCB board. Typically electrical connection between pill 276 and the electrical contact on the PCB board will close a circuit thereby initiating an actuation of some sort (e.g. to close a circuit which initiates the window of a car to open or close automatically).

Figure 18:
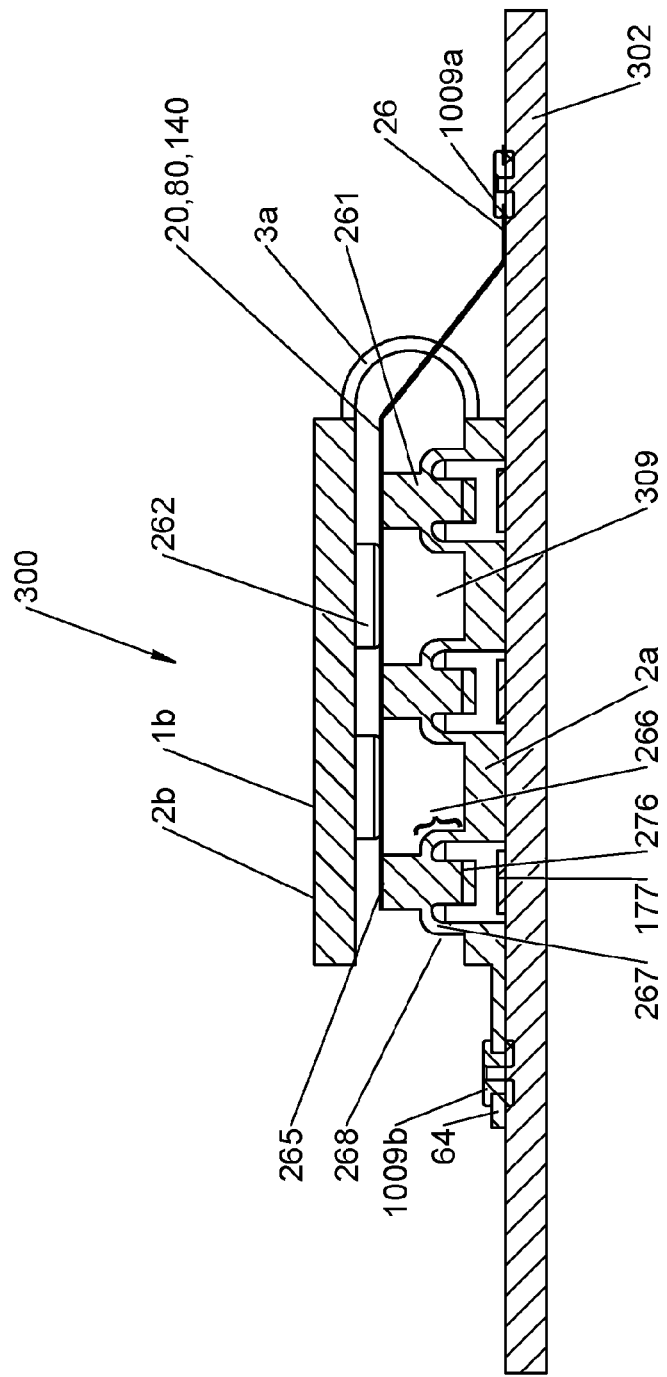
FIG. 18 provides a cross sectional view of a capacitor formed using the strip of FIGS. 16 and 17, and which has been mounted on a PCB board.

The strip 260 can be used with any of a foil 20 of FIG. 3a,b, a foil 80 FIG. 9a,b or a foil 140 of FIG. 13b to form capacitor 300 as shown in FIG. 18. The capacitor is formed using steps similar to those described above for the previous embodiments. In particular the strip is folded at the first flexible portion 3a to sandwich the foil between the first and second regions 2a,b to form a capacitor 300 as shown in FIG. 18.

Referring to FIG. 18 which shows a cross sectional view of a capacitor 300 which can be formed using the strip 260 of FIGS. 16 and 17 and a foil 20,80,140. FIG. 18 shows the capacitor 300 mounted on a PCB board 302. The capacitor 300 is arranged so that the pill 276 of each nodule 261 is aligned over a respective electrical contact 177 provided on the PCT board 302 so that when a force is applied which causes the skirt portion 266 to collapse inwardly, the inward collapsing of the skirt portion 266 moves the pill 276 so that it establishes electrical connection with the electrical contact 177 on the PCT board 302. This electrical connection can enable or disable or adjust any kind of electrically controlled function (e.g. the closing or opening of an window in a car).

During use, a force may be applied by a user to the exposed surface 1b of the second region 2b of the strip 260. The second region 2b will thus move in the direction towards the first region 2a; the nodules 262 on the second region 2b will push the foil 20,80,140 into the spaces 309 between the nodules 261 on the first region 2a. As the foil 20,80,140 is moved further into the spaces 309 between the nodules 261 on the first region 2a it will eventually apply a downward force to the key top 265 of the nodules 262 sufficient to cause the skirt portion 266 of at least some of the nodules 262 to collapse inwardly, thus causing the pill 276 of that nodule 261 to establishes electrical connection with a corresponding electrical contact 177 on the PCT board 302.

Furthermore, as was the case for the previous embodiments, as the second region 2b will is moved in the direction towards the first region 2a the capacitance will increase as the electrically conductive coating 15 (which defines one electrode of a capacitor) and the electrically conducting coating 25 on the foil (which defines the other electrode of the capacitor) are moved closer together and/or as the foil 20,80,140 is stretched to increase the area of the electrically conducting layer 25. The capacitance will continue to increase as additional force is applied to move the second region 2b to cause skirt portion 266 of at least some of the nodules 262 to collapse inwardly, thus causing the pill 276 of that nodule 261 to establish electrical connection with a corresponding electrical contact 177 on the PCB board 302; the capacitance of the capacitor 300 is dependent on how close the second region 2b is moved to the first region 2a, and how much the foil 20,80,140 is stretched, and both of these aspects are directly related to the force applied by the user. Thus advantageously the force which the user applies to cause the pill(s) 276 to establish electrical connection with corresponding electrical contact(s) on the PCT board can be determined from the capacitance of the capacitor 300.

Thus in the embodiment of the capacitor 300 illustrated in FIG. 18, the capacitance of the capacitor 300 changes as the user applies a force to move the second region 2b in the direction towards the first region 2a, and also electrical connection between the pill of one or more nodules 261 and electrical contacts on the PCB board is established.

Figure 15:
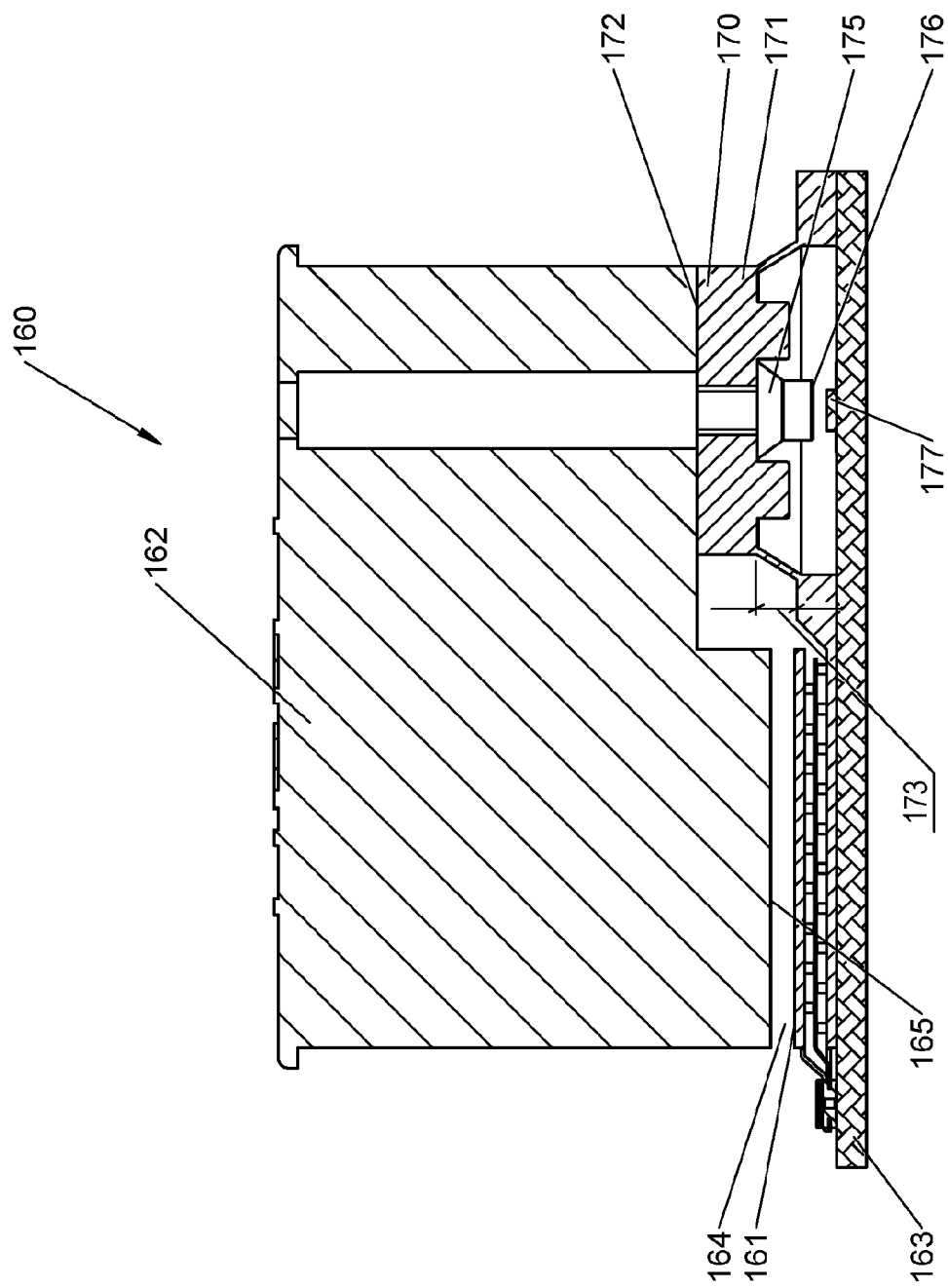
FIG. 15 provides a cross sectional view of an assembly according to a further aspect of the present invention, which uses a capacitive sensor according to the present invention.

FIG. 15 shows an assembly 160 which includes a capacitor 161 according to any one of the above-mentioned embodiments. In the assembly 160 the capacitor 161 is located on a PCB board 163.

The assembly 160 further comprises a button element 162 which a user can press. A portion 165 of the button element 162 overlay the capacitor 161; when the button element 162 is shaped such that when the button element is not pressed a gap 164 is present between the button element 162 and the capacitor 161 (as illustrated in FIG. 15. However when the button is pressed the button element 162 will move towards the capacitor 161 and the portion 165 will eventually abut and subsequently press against the capacitor 161 thereby moving the second region 2b towards the first region 2a to cause a change in the capacitance of the capacitor 161.

The assembly 160 will preferably further comprise a processor (not shown) which can read the capacitance of the capacitor and process the capacitance measure to determine the force which is applied to the user to the button element 162.

The assembly 160 further comprises a silicone interface 170 which is mounted on the PCB board 163. The button element 162 is in turn mounted on the silicone interface 170. More specifically the silicone interface 170 comprises a compressible nodule 171 and the button element 162 mounted on this nodule 171. The nodule 171 has a support surface 172 on which the button element 162 rests, and a skirt portion 173 which is configured such that it can collapse inwardly when a force is applied to the button element to allow the nodule 171 to be compressed. The skirt portion 173 is a membrane. The thickness of the material defining the skirt portion 173 is less than the thickness of the other parts of the nodule 171.

An electrical contact 176 (commonly referred to as a "pill") is further provided on an inner surface 175 of the skirt portion 173; and the nodule 171 is positioned so that the pill 176 is aligned over an electrical contact 177 provided on the PCT board 163. When a force is applied to the button element to cause the skirt portion 173 to collapse inwardly, this moves the pill 176 so that it establishes electrical connection with the electrical contact 177 provided on the PCT board 163. Typically electrical connection between pill 176 and the electrical contact 177 on the PCB board 163 will close a circuit thereby initiate an actuation of some sort (e.g. the window of a car will automatically open or close).

In the most preferred embodiment the skirt portion 173 will be configured to have at least two inward collapse phases; for example the skirt portion 173 is preferably configured so when a first force is applied to the button element the skirt portion 173 will collapse inwardly a predefined amount (a first inward collapse phase), and when a second force is applied to the button element the skirt portion 173 will collapse further inwardly a predefined amount (a second inward collapse phase). Typically the second force will need to be larger than the first force to initiate the second inward collapse phase. In order to achieve this the skirt portion 173 may have a double dome configuration, i.e. a first dome-shaped portion mounted on a second dome-shaped portion; the first dome-shaped portion may collapse inward upon the application of a first force and the second dome-shaped portion may collapse inward upon the application of a second force.

In the assembly 160 of FIG. 15 the button element is shaped so that the during the first inward collapse phase of the skirt portion 173 the portion 164 is moved towards the capacitor 161 but does not apply a force to the capacitor 161; after the first inward collapse phase of the skirt portion 173 is complete, and immediately before the second inward collapse phase of the skirt portion 173 begins the portion 164 abuts the capacitor 161. Thus during the second inward collapse phase of the skirt portion 173 the force which is applied to the button element 162 which causes the skirt portion 173 to collapse further inwardly, will simultaneously cause the portion 164 of the button element 162 to push against the capacitor 161 to cause a change in the capacitance of said capacitor 161.

Various modifications and variations to the described embodiments of the invention will be apparent to those skilled in the art without departing from the scope of the invention as defined in the appended claims. Although the invention has been described in connection with specific preferred embodiments, it should be understood that the invention as claimed should not be unduly limited to such specific embodiment.

One particular important variation is with respect to the foils 20, 80,180,140 shown in FIGS. 3a-6b,9a-12,13b-15 and 18, each of which comprises a silicone core 24,84, which is electrically non-conductive, and which has a coating of electrically conductive material 25. In another embodiment of the present invention the foil has a different configuration: instead of the foil 20, 80,180,140 having an electrically non-conductive silicon core 24,84 and coating of electrically conductive material 25, the foil is composed of an electrically conductive material. For example, the foil may be composed of: Silicone material doped with carbon particles such as Carbon Black, Graphene, Fullerenes, Nanotubes; and/or metallic particles such as flakes and/or nanowires of Silver, Gold, Tungsten and/or Nickel; and/or semiconducting particles such as Silicon, Indiumphosphid and Galliumnitride particles; and/or conductive polymers such as Poly-3,4-ethylendioxythiophen (PEDOT, PEDT), Polyethin (or Polyacetylen, PAC), Polyanilin (PAni), Polyparaphenylen (PPP), Polythiophen (PT) and/or Polypyrrol (PPy). The foil may comprise conductive fibres and/or a conductive cloth, which may comprise metal and/or conductive polymer(s). In such an embodiment the foil (and not a coating of electrically conductive material 25) defines an electrode of the capacitor.

Likewise with respect to the strips 1,50,60,110,130,260 shown in FIGS. 1,2,4a-8,10-13a,14-18, each of which comprises a silicon core 18, which is electrically non-conductive, and which has a coating of electrically conductive material 15, and which has a coating of electrically insulating material 16 provided on the coating of electrically conductive material 15. In another embodiment of the present invention the strip has a different configuration: Instead of the strip 1,50,60,110,130,260 having a electrically non-conductive silicon core 18 and coating of electrically conductive material 15, the strip comprises a core which is composed of electrically conducting material and the coating of insulating material 16 which is provided on the first surface 19a of the strip. For example the strip may comprise a core which is composed of Silicone material doped with carbon particles such as Carbon Black, Graphene, Fullerenes, Nanotubes; and/or metallic particles such as flakes and/or nanowires of Silver, Gold, Tungsten and/or Nickel; and/or semiconducting particles such as Silicon, Indiumphosphid and Galliumnitride particles; and/or conductive polymers such as Poly-3,4-ethylendioxythiophen (PEDOT, PEDT), Polyethin (or Polyacetylen, PAC), Polyanilin (PAni), Polyparaphenylen (PPP), Polythiophen (PT) and/or Polypyrrol (PPy). The core may comprise conductive fibres and/or a conductive cloth, which may comprise metal and/or conductive polymer(s). A coating of insulating material 16 is provided on the first surface 19a of the core, so as to electrically isolate the strip from the foil. In such an embodiment the core of the strip (and not a coating of electrically conductive material 15) defines an electrode of the capacitor. It should be understood that in a further variation of this embodiment the insulating material 16 is instead provided on opposing surfaces of foil and not on the core of the strip.

Figure 19:
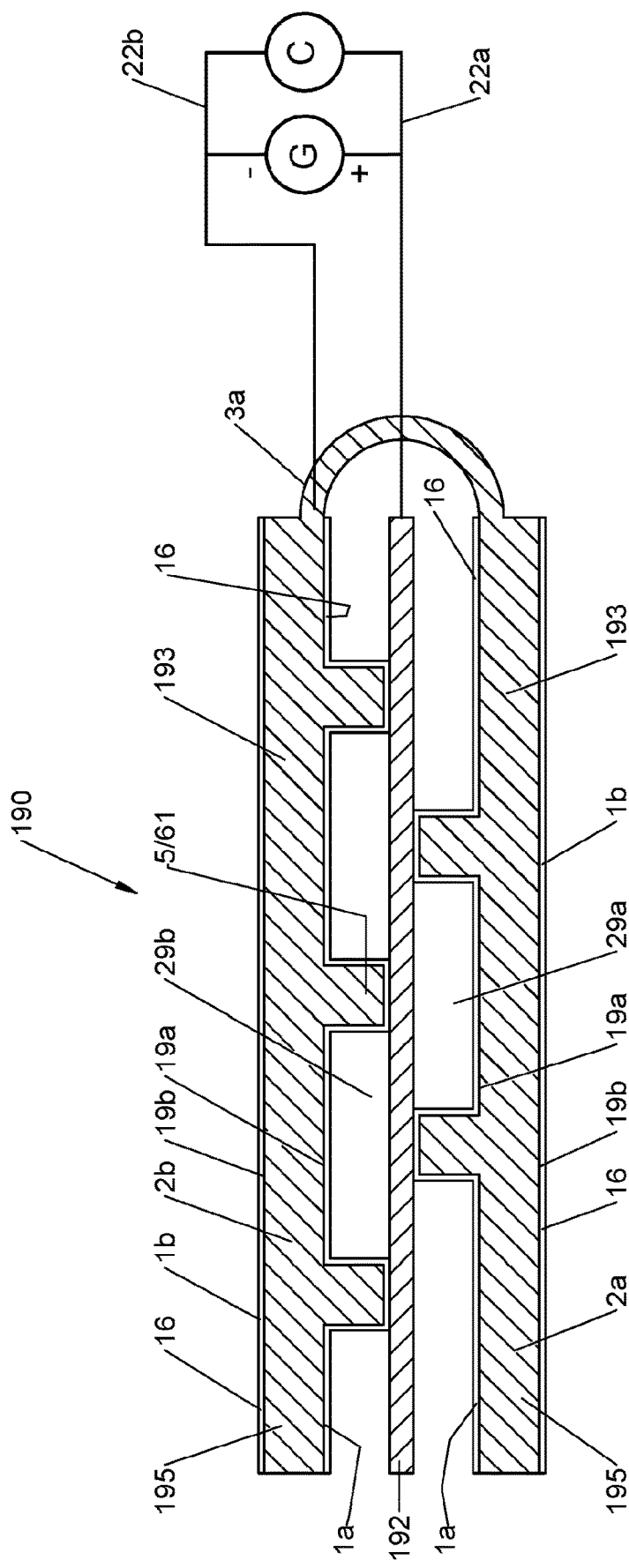
FIG. 19 provides a cross-sectional view of a capacitor 190 according to a further embodiment of the present invention, in which the foil and the strip are without an electrically conductive coating.

FIG. 19 provides a cross-sectional view of a capacitor 190 according to a further embodiment of the present invention, in which the foil and the strip are without an electrically conductive coating. In this example the capacitor 190 comprises, a foil 192 which is composed of electrically conductive material; specifically, in this example the foil is composed of Silicone material doped with carbon particles such as Carbon Black, Graphene, Fullerenes, Nanotubes. The capacitor 190 further comprises a strip 193 which comprises a core 195 which is also composed of electrically conductive material; specifically, in this example the core 195 of the strip 193 is composed of Silicone material doped with carbon particles such as Carbon Black, Graphene, Fullerenes, Nanotubes. A coating of insulating material 16 is provided on the first surface 19a of the core 195. A coating of insulating material 16 is also provided on the second surface 19b of the core 195, however it should be understood that the coating on the second surface 19b is not essential. In this embodiment the core 195 of the strip (and not a coating of electrically conductive material 15) defines the first electrode of the capacitor 190 and the foil 192 defines the second electrode of the capacitor 190.

In the many of the embodiment described above the coating of electrically insulating material 16 is provided as a coating of electrically conductive material 15 of the strip. However in a further variation, the coating of electrically insulating material 16 could be provided as a coating of electrically conductive material 25 of the foil, instead. The purpose of the coating of electrically insulating material 16 is to electrically isolate the conductive material of the strip from the conductive material of the foil so that the conductive material of the strip can define a first electrode of the capacitor and the conductive material of the foil can define a second electrode of the capacitor; it is clear that this electrical isolation can be achieved either by having the electrically insulating material on the strip or on the foil so long as the electrically insulating material is interposed between the strip and the foil.

The invention claimed is:

1. A capacitor comprising,
a flexible strip comprising a first region having plurality of nodules and a second region having a plurality of nodules, and wherein the strip further comprises a first flexible portion which is interposed between the first and second regions, and wherein the flexible strip is folded at the first flexible portion so that, the first and second regions (2a,b) overlay one another and the nodules of the first region extend in a direction towards the second region, and the nodules of the second region extend in a direction towards the first region, and wherein the flexible strip comprises electrically conductive material; and
a flexible foil which is arranged to be interposed between the first and second regions, and wherein the foil comprises electrically conductive material,
wherein said flexible foil further comprises a plurality of depressions defined therein each which can receive at least a portion of a respective nodule on the first and the second regions of the flexible strip.

2. A capacitor according to claim 1 wherein the foil comprises a core having an electrically conductive coating.

3. A capacitor according to claim 1 wherein the flexible strip comprises, a core having an electrically conductive coating, and wherein insulating coating is further provided on the electrically conductive coating.

4. A capacitor according to claim 1 wherein the thickness of the first flexible portion is less than the thickness of the first and second regions of the strip.

5. A capacitor according to claim 1 wherein the plurality of nodules in the first region are offset from the plurality of nodules in the second region.

6. A capacitor according to of claim 1 wherein the plurality of nodules in the first region are aligned with the plurality of nodules in the second region.

7. A capacitor according to claim 1 wherein the single strip further comprises one or more alignment windows provided on opposite sides of an axis along with the flexible strip is folded; and wherein when said alignment windows are aligned so that the first and second regions are in a predefined position with respect to one another.

8. A capacitor according to claim 1 wherein the flexible strip further comprises a second flexible portion which connects said foil to either the first or second region, and wherein the single strip is folded at the second flexible portion so that the foil is arranged to be interposed between the first and second regions.

9. A capacitor according to claim 1 wherein the plurality of nodules comprise nodules which are substantially incompressible.

10. A capacitor according to claim 1 wherein the plurality of nodules comprise nodules which are configured to be compressible.

11. A capacitor according to claim 1 wherein the plurality of nodules comprise nodules which comprise a skirt.

12. A capacitor according to claim 1 wherein the foil further comprises a plurality of depressions defined on a first surface thereof and plurality of depressions defined on a second surface thereof which is opposite to the first surface, and wherein at least a portion of each nodule is received into a respective depression.

13. A capacitor according to claim 1 wherein the foil comprises a reinforcement member, wherein said reinforcement member defines a pocket which can receive the second region of the strip; and the strip further comprises a frame which is arranged to surround the first region of the strip, and wherein said frame defines a pocket which can receive said foil.

14. A method of manufacturing a capacitor according to claim 1, the method comprising the steps of,
    providing a flexible strip comprising a first region having a plurality of nodules and a second region having a plurality of nodules, and wherein the flexible strip further comprises a first flexible portion interposed between the first and second regions, and wherein the flexible strip comprises electrically conductive material;
    providing a flexible foil which comprises a core which comprises electrically conductive material;
    folding the strip at the first flexible portion so that the first and second regions overlay one another and the nodules in the first region extend in a direction towards the second region, and the nodules in the second region extend in a direction towards the first region, and arranging the foil to be interposed between the first and second regions;
    arranging the strip so that at least a portion of each respective nodule on the first and the second regions of the flexible strip is received into a respective depression defined in the foil.

15. An assembly comprising a capacitor according to claim 1, and a button element which a user can press, and wherein the button element is supported on a compressible nodule, and wherein a portion of the button element overlays at least a portion of the first and second regions of the capacitor such that when the button element is pressed to compress the nodule the portion of the button element which overlays the first and second regions of the capacitor can press against the capacitor effect a change in the capacitance of the capacitor.

* * * * *